United States Patent
Chen

(10) Patent No.: US 9,007,538 B2
(45) Date of Patent: Apr. 14, 2015

(54) BARRIER FUNCTIONAL FILM AND MANUFACTURING THEREOF, ENVIRONMENTAL SENSITIVE ELECTRONIC DEVICE, AND DISPLAY APPARATUS

(71) Applicant: Industrial Technology Research Institute, Hsinchu (TW)

(72) Inventor: Kuang-Jung Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 43 days.

(21) Appl. No.: 14/051,461

(22) Filed: Oct. 11, 2013

(65) Prior Publication Data

US 2014/0118638 A1     May 1, 2014

Related U.S. Application Data

(60) Provisional application No. 61/720,409, filed on Oct. 31, 2012.

(30) Foreign Application Priority Data

May 31, 2013 (TW) .............................. 102119351 A

(51) Int. Cl.
    *G02F 1/1335*     (2006.01)
    *G02F 1/1339*     (2006.01)
    (Continued)

(52) U.S. Cl.
    CPC . *H05K 7/06* (2013.01); *G02B 1/105* (2013.01)

(58) Field of Classification Search
    CPC ... G02F 1/13338; G02F 3/0412; G02F 3/045; G02F 3/044; G02F 2001/13312; G02F 1/1339; G02F 1/1341; G02F 1/1345; G02F 1/133351; G02F 1/13394
    USPC .................................................. 349/12, 153
    See application file for complete search history.

(56) References Cited

U.S. PATENT DOCUMENTS 5,730,919 A     3/1998     Wilfong et al.
6,783,349 B2     8/2004     Neavin et al.
(Continued)

FOREIGN PATENT DOCUMENTS

JP     2010225362     10/2010
TW     201005063     2/2010
(Continued)

OTHER PUBLICATIONS

Fu et al., "Room Temperature Plasma Assisted Atomic Layer Deposition Al2O3 Film's Encapsulation Application in Organic Light Emitting Diodes," International Semiconductor Device Research Symposium (ISDRS), Dec. 7-9, 2011, pp. 1-2.
Wel et al., "B-Dry®: Edge Sealant for Sensitive Photovoltaic Modules," 37th IEEE Photovoltaic Specialists Conference (PVSC), Jun. 19-24, 2011, pp. 001371-001374.
(Continued)

*Primary Examiner* — Mike Qi
(74) *Attorney, Agent, or Firm* — Jianq Chyun IP Office

(57) ABSTRACT

A barrier functional film that includes a substrate, at least one side wall barrier structure, a releasing film, and an adhesive is provided. The side wall barrier structure is located on the substrate. The releasing film is located above the substrate, and the side wall barrier structure is located between the substrate and the releasing film. The adhesive covers the side wall barrier structure and is located between the substrate and the releasing film. An environmental sensitive electronic device, a display apparatus, and a manufacturing method of a barrier functional film are also provided.

54 Claims, 22 Drawing Sheets

(51) Int. Cl.
  *H05K 7/06*   (2006.01)
  *G02B 1/10*   (2006.01)

(56) References Cited

U.S. PATENT DOCUMENTS

| | | | |
|---|---|---|---|
| 6,827,886 B2 | 12/2004 | Neavin et al. | |
| 6,830,713 B2 | 12/2004 | Hebrink et al. | |
| 7,652,424 B2* | 1/2010 | Park et al. | 313/512 |
| 2009/0167132 A1* | 7/2009 | Bae et al. | 313/1 |

FOREIGN PATENT DOCUMENTS

| | | |
|---|---|---|
| TW | 201037799 | 10/2010 |
| TW | 201212180 | 3/2012 |

OTHER PUBLICATIONS

Li et al, "Thin Film Encapsulation of OLED Displays with Organic-Inorganic Composite Film," 58th Electronic Components and Technology Conference (ECTC), May 27-30, 2008, pp. 1819-1824.

Wang et al., "Direct Encapsulation of Organic Light-Emitting Devices (OLEDs) Using Photo-Curable co-Polyacrylate/Silica Nanocomposite Resin," IEEE Transactions on Advanced Packaging 30 (3), Aug. 2007, pp. 421-427.

Sang et al., "Thin Film Encapsulation for OLED Display using Silicon Nitride and Silicon Oxide Composite Film," Electronic Packaging Technology and High Density Packaging (ICEPT-HDP), Aug. 8-11, 2011, pp. 1175-1178.

Zhang et al., "Effect of Encapsulation on OLED Characteristics with Anisotropic Conductive Adhesive," 2nd Electronics System-Integration Technology Conference (ESTC), Sep. 1-4, 2008, pp. 613-616.

* cited by examiner

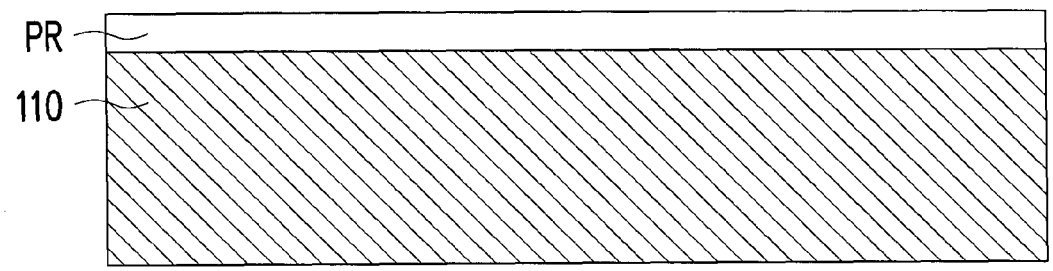
FIG. 8A-1
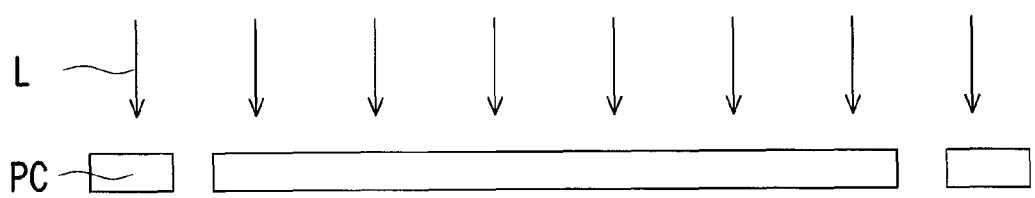
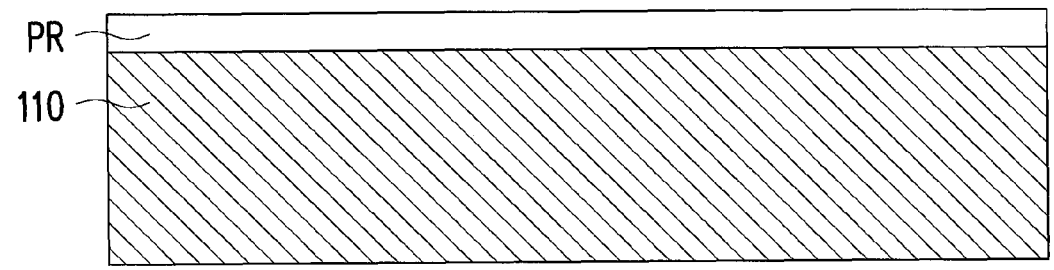
FIG. 8A-2
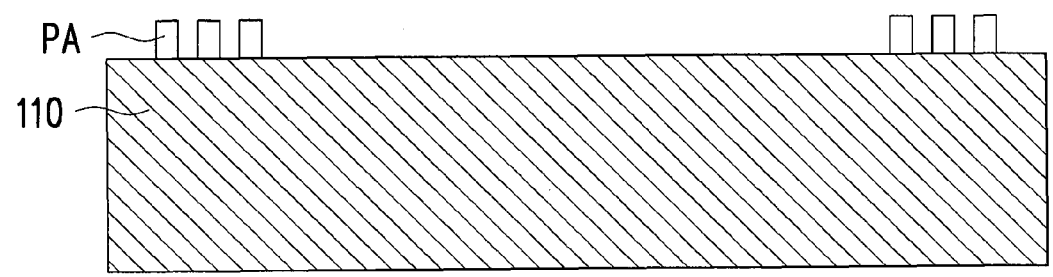
FIG. 8A-3

BARRIER FUNCTIONAL FILM AND MANUFACTURING THEREOF, ENVIRONMENTAL SENSITIVE ELECTRONIC DEVICE, AND DISPLAY APPARATUS

CROSS-REFERENCE TO RELATED APPLICATION

This application claims the priority benefits of U.S. provisional application Ser. No. 61/720,409, filed on Oct. 31, 2012 and Taiwan application serial no. 102119351, filed on May 31, 2013. The entirety of each of the above-mentioned patent applications is hereby incorporated by reference herein and made a part of this specification.

TECHNICAL FIELD

The technical field relates to a functional film and a manufacturing method thereof, an environmental sensitive electronic device, and a display apparatus. The disclosure relates to a barrier functional film and a manufacturing method thereof, an environmental sensitive electronic device, and a display apparatus.

BACKGROUND

Flexible environmental sensitive electronic devices or display apparatuses are applicable due to bendability, portability, compliance with safety standards, and the wide range of applications. The flexible substrate of the flexible environmental sensitive electronic device or the display apparatus may serve to hold electronic devices and/or act as a cover, so as to perform a packaging process on the electronic devices. Since the flexible substrate may not block the moisture and the oxygen, moisture infiltration and oxygen diffusion may speed up the aging process of the environmental sensitive electronic devices on the flexible substrate. The life time of environmental sensitive electronic devices may not meet the market needs.

SUMMARY

According to an exemplary embodiment of the disclosure, a barrier functional film that includes a substrate, at least one side wall barrier structure, a releasing film, and an adhesive is provided. The side wall barrier structure is located on the substrate. The releasing film is located above the substrate, and the side wall barrier structure is located between the substrate and the releasing film. The adhesive covers the side wall barrier structure and is located between the substrate and the releasing film.

According to an exemplary embodiment of the disclosure, a manufacturing method of a barrier functional film includes forming at least one side wall barrier structure on a substrate; forming an adhesive is on a releasing film; adhering the releasing film to the substrate through the adhesive, wherein the adhesive covers the side wall barrier structure, and the adhesive is located between the substrate and the releasing film.

According to an exemplary embodiment of the disclosure, an environmental sensitive electronic device includes a first substrate, at least one first side wall barrier structure, an environmental sensitive electronic device back plate, and a first adhesive. The first side wall barrier structure is located on the first substrate. The first substrate is located above the environmental sensitive electronic device back plate, and the first side wall barrier structure is located between the first substrate and the environmental sensitive electronic device back plate. The first adhesive is located between the first substrate and the environmental sensitive electronic device back plate and covers the first side wall barrier structure. The first substrate and the first side wall barrier structure are adhered to the environmental sensitive electronic device back plate through the first adhesive.

According to an exemplary embodiment of the disclosure, a display apparatus includes an environmental sensitive electronic device, a second substrate, at least one second side wall barrier structure, and a second adhesive. The second side wall barrier structure is located on the second substrate and between the environmental sensitive electronic device and the second substrate. The second adhesive is located between the second substrate and the environmental sensitive electronic device and covers the second side wall barrier structure. Here, the second substrate and the second side wall barrier structure are adhered to the environmental sensitive electronic device through the second adhesive.

Several exemplary embodiments accompanied with figures are described in detail below to further describe the disclosure in details.

BRIEF DESCRIPTION OF DRAWINGS

The accompanying drawings are included to provide further understanding, and are incorporated in and constitute a part of this specification. The drawings illustrate exemplary embodiments and, together with the description, serve to explain the principles of the disclosure.

FIG. 8A-1 to FIG. 8D are schematic cross-sectional views illustrating a manufacturing method of a barrier functional film according to an exemplary embodiment of the disclosure.

DETAILED DESCRIPTION OF DISCLOSED EMBODIMENTS

Figure 1A:
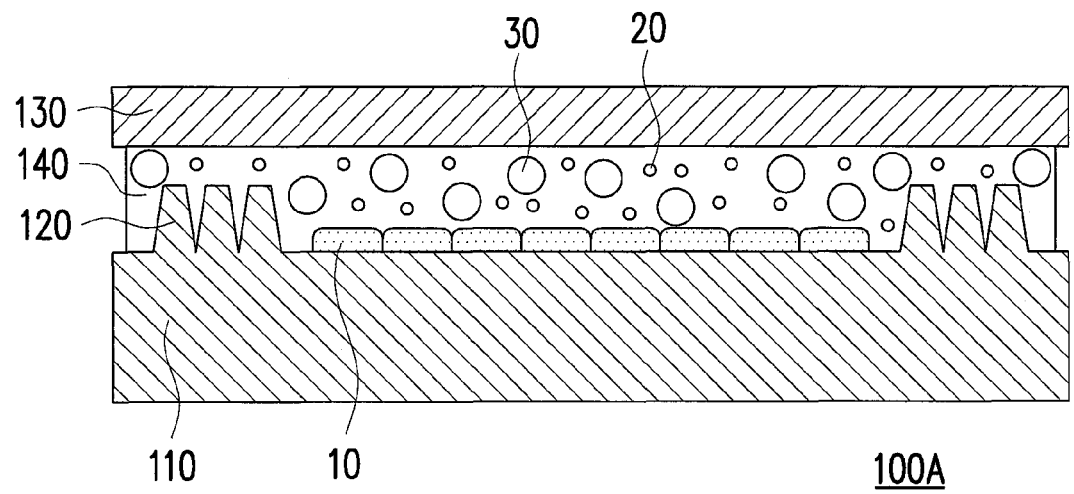
FIG. 1A is a schematic cross-sectional view illustrating a barrier functional film according to a first exemplary embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
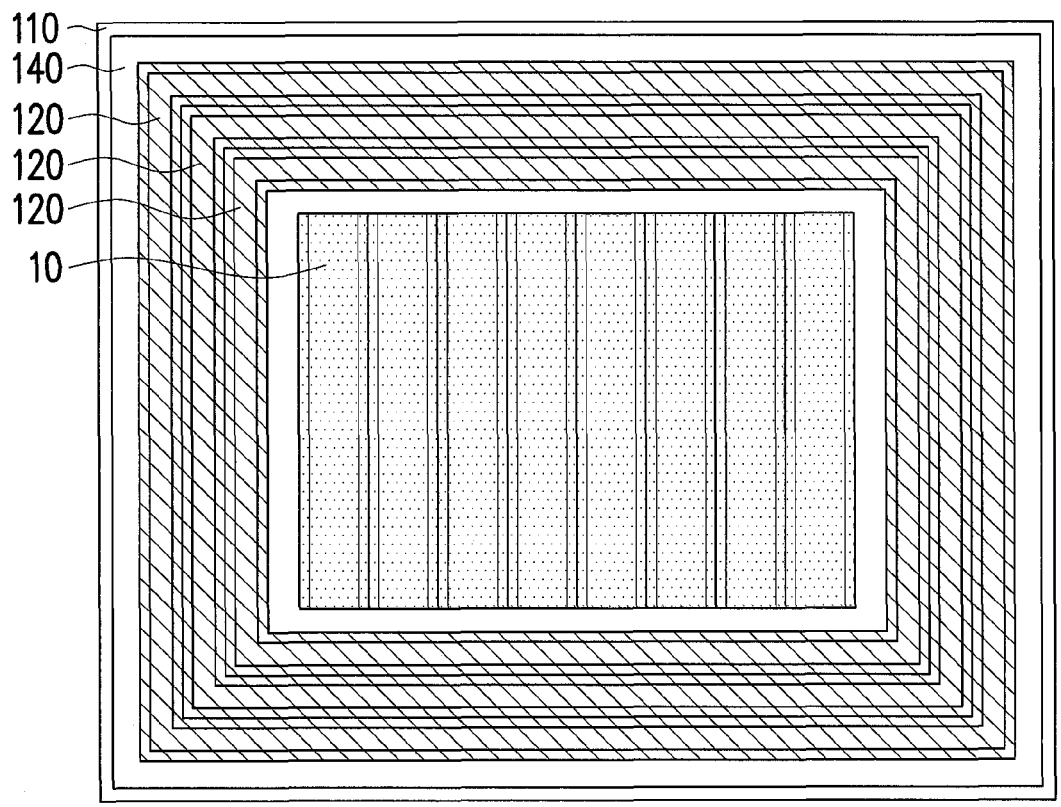
FIG. 1B is a top view illustrating the barrier functional film depicted in FIG. 1A.

FIG. 1A is a schematic cross-sectional view illustrating a barrier functional film according to a first exemplary embodiment of the disclosure. FIG. 1B is a top view illustrating the barrier functional film depicted in FIG. 1A. With reference to FIG. 1A, the barrier functional film 100A described in the present exemplary embodiment includes a substrate 110, at least one side wall barrier structure 120, a releasing film 130, and an adhesive 140. The side wall barrier structure 120 is located on the substrate 110. The releasing film 130 is located above the substrate 110, and the side wall barrier structure 120 is located between the substrate 110 and the releasing film 130. The adhesive 140 covers the side wall barrier structure 120 and is located between the substrate 110 and the releasing film 130. The releasing film 130 of the barrier functional film 100A may be torn off from the adhesive 140 through a properly exerted force.

In the present exemplary embodiment, the substrate 110 is a metal substrate or a glass substrate, for instance, and a getter 10 may be further configured on the substrate 110. The getter 10 is located between the substrate 110 and the adhesive 140 and surrounded by the side wall barrier structure 120. The getter 10 is a tape getter or an evaporation getter that may serve to absorb moisture and oxygen, for instance. As shown in FIG. 1B, the getter 10 described herein is a tape getter with a rectangular bottom area. In other exemplary embodiments that are not shown in the drawings, the getter 10 may be a sheet-like getter with a polygonal bottom area, a circular bottom area, or an elliptic bottom area, which should not be construed as limitations to the disclosure.

The barrier functional film 100A further includes a heat dissipation auxiliary material 20 that is distributed in the adhesive 140 in form of particles, for instance. The heat dissipation auxiliary material 20 has a high heat dissipation coefficient, such as diamond, a diamond-like material, copper, silver, gold, aluminum, platinum, a ceramic material, or an oxide thereof, so as to dissipate heat. The barrier functional film 100A may also include an anti-electromagnetic interference material 30 that is distributed in the adhesive 140 in form of particles, for instance. The anti-electromagnetic interference material 30 for example is gold, silver, copper, aluminum, carbon, carbon fiber or lead that may lessen electromagnetic effects.

As illustrated in FIG. 1A and FIG. 1B, the side wall barrier structure 120 described in the present exemplary embodiment is an enclosed structure on the peripheral of the substrate 110, and a shape of the cross-section of the side wall barrier structure 120 perpendicular to the substrate 110 is a trapezoidal shape, for instance. In other exemplary embodiments of the disclosure not shown herein, the side wall barrier structure 120 is a partially enclosed structure on the peripheral of the substrate 110, the shape of the cross-section may be a rectangular shape, a polygonal shape, a circular shape, or an elliptic shape, which should not be construed as a limitation to the disclosure. The side wall barrier structure 120 is usually formed by exposure, development, and etching; alternatively, an etching process is performed on the metal substrate 110, and the enclosed structure formed on the peripheral of the metal substrate 110. According to another embodiment of the disclosure not shown herein, the side wall barrier structure 120 may be an open or partially enclosed structure.

The releasing film 130 is, for instance, a polyethylene terephthalate (PET) compound or a silicone-containing compound and is adhered to the adhesive 140, so as to prevent the adhesive 140 from being exposed and then contaminated by external impurities. Here, the releasing film 130 may be separated from the adhesive 140 through exerting a proper force. The adhesive 140 is an optical adhesive with certain transmittance, for instance; In the present exemplary embodiment, the adhesive 140 may also be an optical adhesive with reflective or transflective properties. The adhesive 140 is made of epoxy resin, an acrylic compound, silicone base resin, etc. According to the present exemplary embodiment, the adhesive 140 is made of a material that may be cured by heat or light; namely, the adhesive 140 has not been cured by heat or light, for instance.

The substrate 110 of the barrier functional film 100A described above is a metal substrate or a glass substrate, for instance, and the getter 10 is a tape getter that is arranged on the substrate 110 and has a rectangular bottom area. In other exemplary embodiments, any different structural design or configuration that may prevent moisture infiltration and oxygen diffusion is still deemed an applicable technical scheme and falls within the scope of protection provided in the disclosure. The following are descriptions of different exemplary embodiments detailing different designs of barrier functional films 100B to 100R.

Figure 2:
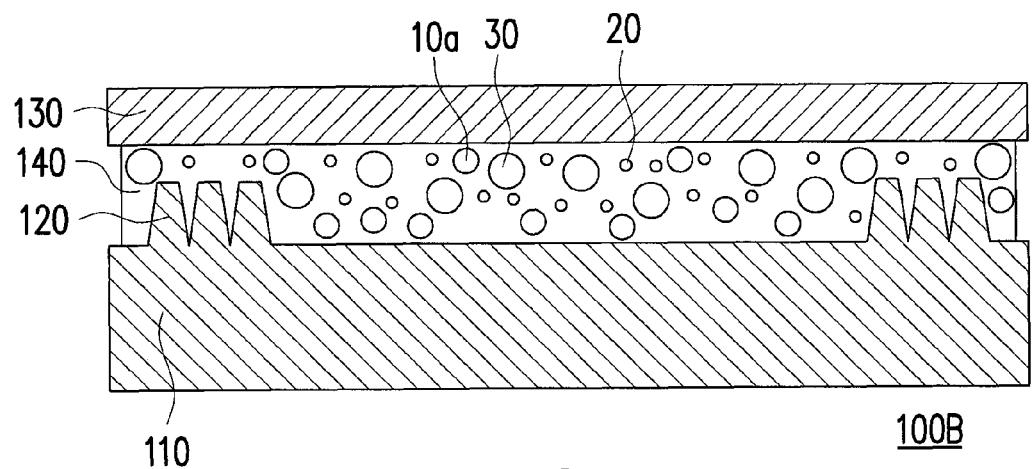
FIG. 2 is a schematic cross-sectional view illustrating a barrier functional film according to a second exemplary embodiment of the disclosure.

FIG. 2 is a schematic cross-sectional view illustrating a barrier functional film according to a second exemplary embodiment of the disclosure. The barrier functional film 100B depicted in FIG. 2 is similar to the barrier functional film 100A depicted in FIG. 1A, whereas one of the differences therebetween lies in that the getter 10a of the barrier functional film 100B depicted in FIG. 2 is distributed in the adhesive 140 in form of particles, for instance. The getter 10a may be a transparent getter or an opaque getter for absorbing moisture and oxygen.

Figure 3A:
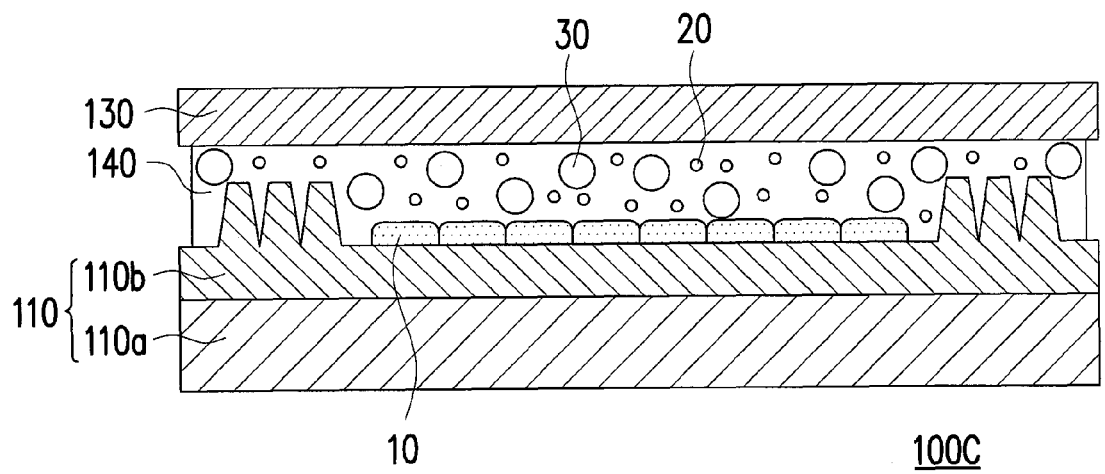
FIG. 3A is a schematic cross-sectional view illustrating a barrier functional film according to a third exemplary embodiment of the disclosure.
Figure 3B:
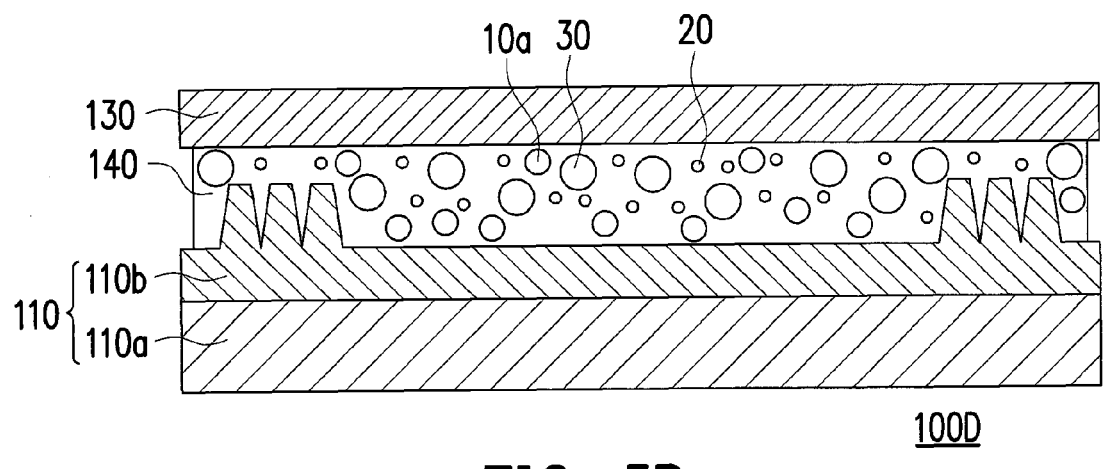
FIG. 3B is a schematic cross-sectional view illustrating a barrier functional film according to a fourth exemplary embodiment of the disclosure.

FIG. 3A is a schematic cross-sectional view illustrating a barrier functional film according to a third exemplary embodiment of the disclosure. FIG. 3B is a schematic cross-sectional view illustrating a barrier functional film according to a fourth exemplary embodiment of the disclosure. The barrier functional film 100C depicted in FIG. 3A is similar to the barrier functional film 100A depicted in FIG. 1A, whereas one of the differences therebetween lies in that the substrate 110 of the barrier functional film 100C shown in FIG. 3A may further include a flexible substrate 110a and a barrier layer 110b. The flexible substrate 110a may be made of polyimide (PI), polyethylene terephthalate (PET), polyethylene naphthalate (PEN), polyethersulfone (PES), polymethyl methacrylate (PMMA), polycarbonate (PC), or metal foil.

The barrier layer 110b is located on the flexible substrate 110a and is made of a single-layered or multi-layered inorganic material, such as silicon nitride ($SiN_x$), silicon oxide ($SiO_x$), silicon oxynitride ($SiN_xO_y$), or aluminum oxide ($Al_2O_3$); the barrier layer 110b may also be made of a hybrid organic-inorganic material, e.g., Si—C polymer. Alternatively, the barrier layer 110b may be a stacked layer containing multiple organic and inorganic material layers, and the organic material may be acrylic, epoxy resin, parylene, or the like. The inorganic material may be formed on the flexible substrate 110a through chemical vapor deposition (CVD) or sputtering. The hybrid organic-inorganic material may be formed on the flexible substrate 110a through CVD. The organic material may be formed on the flexible substrate 110a through CVD, spraying, or coating.

The barrier layer 110b described herein may have a single-layered barrier structure for blocking external moisture and oxygen; in another exemplary embodiment, the barrier layer 110b may also have a barrier structure containing two or more film layers, which should not be construed as a limitation to the disclosure.

The barrier functional film 100D depicted in FIG. 3B is similar to the barrier functional film 100C depicted in FIG. 3A, whereas one of the differences therebetween lies in that the getter 10a of the barrier functional film 100D depicted in FIG. 3B is distributed in the adhesive 140 in form of particles, for instance. In most cases, the getter 10a may be a transparent getter or an opaque getter for absorbing moisture and oxygen.

Figure 4A:
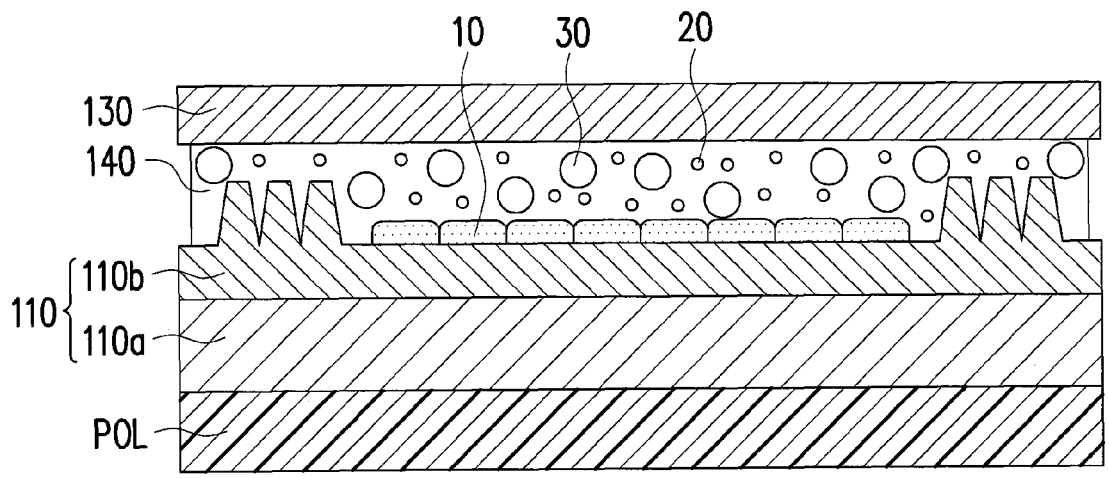
FIG. 4A is a schematic cross-sectional view illustrating a barrier functional film according to a fifth exemplary embodiment of the disclosure.
Figure 4B:
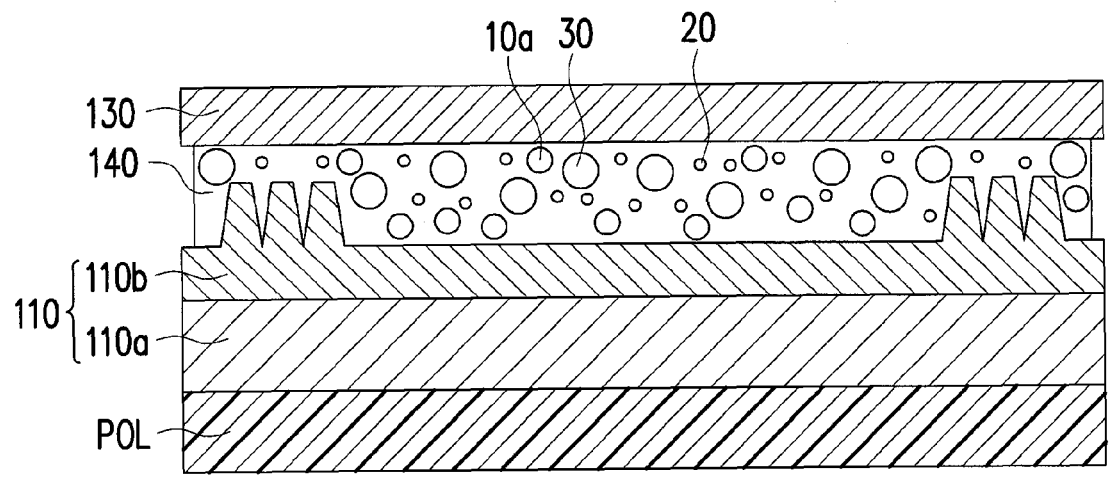
FIG. 4B is a schematic cross-sectional view illustrating a barrier functional film according to a sixth exemplary embodiment of the disclosure.

FIG. 4A is a schematic cross-sectional view illustrating a barrier functional film according to a fifth exemplary embodiment of the disclosure. FIG. 4B is a schematic cross-sectional view illustrating a barrier functional film according to a sixth exemplary embodiment of the disclosure. The barrier functional film 100E depicted in FIG. 4A is similar to the barrier functional film 100C depicted in FIG. 3A, whereas one of the differences therebetween lies in that the barrier functional film 100E depicted in FIG. 4A further includes a quarter-wave compensating and polarizing film POL that is located on the flexible substrate 110a, and the quarter-wave compensating and polarizing film POL and the barrier layer 110b are respectively located at two opposite sides of the flexible substrate 110a. The quarter-wave compensating and polarizing film POL refers to a phase retardation film whose retardation has a magnitude of a quarter of a specific wavelength for the wavelength λ, for instance.

The barrier functional film 100F depicted in FIG. 4B is similar to the barrier functional film 100E depicted in FIG. 4A, whereas one of the differences therebetween lies in that the getter 10a of the barrier functional film 100F depicted in FIG. 4B is distributed in the adhesive 140 in form of particles, for instance. In most cases, the getter 10a may be a transparent getter or an opaque getter for absorbing moisture and oxygen.

Figure 5A:
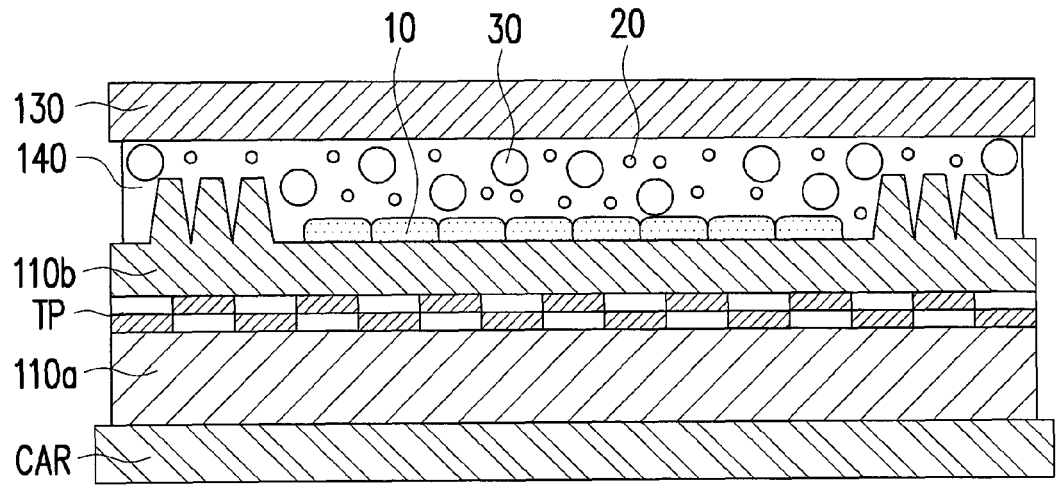
FIG. 5A is a schematic cross-sectional view illustrating a barrier functional film according to a seventh exemplary embodiment of the disclosure.
Figure 5B:
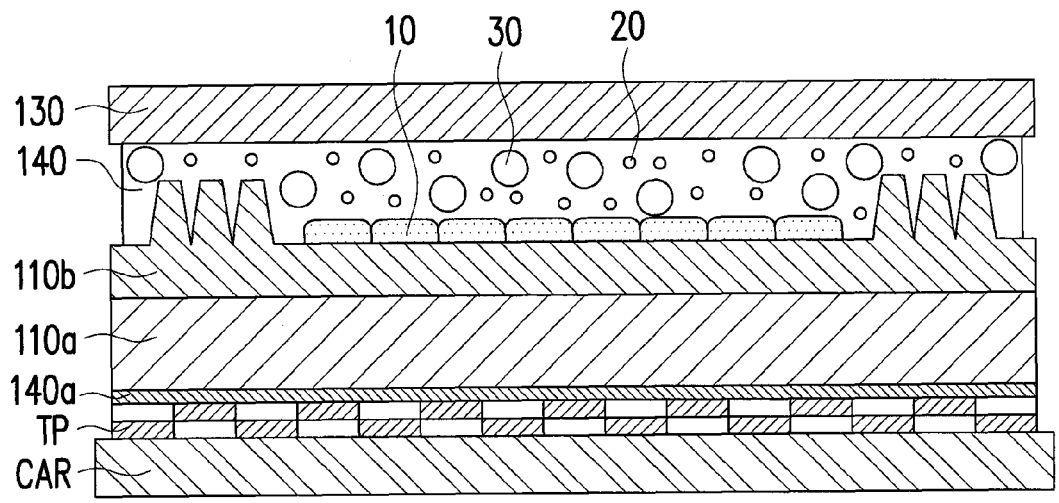
FIG. 5B is a schematic cross-sectional view illustrating a barrier functional film according to an eighth exemplary embodiment of the disclosure.
Figure 5C:
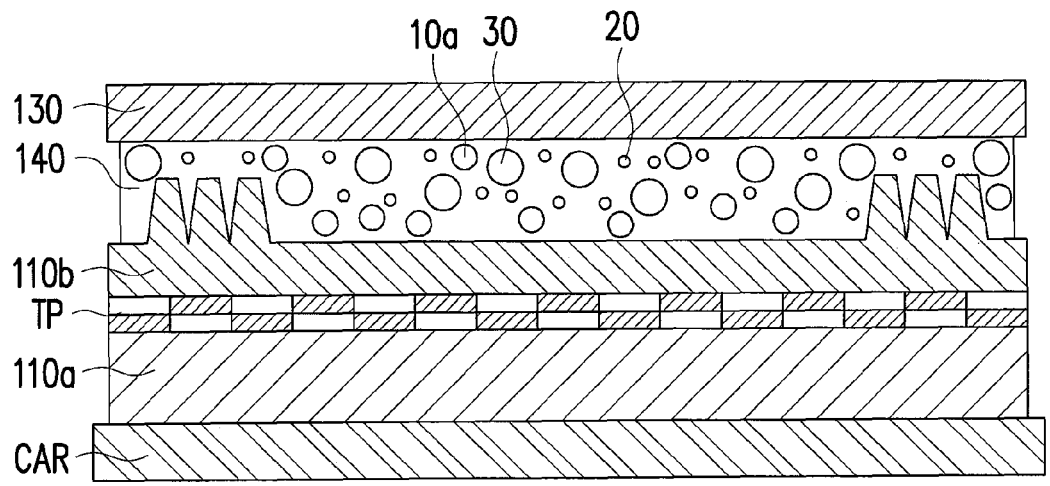
FIG. 5C is a schematic cross-sectional view illustrating a barrier functional film according to a ninth exemplary embodiment of the disclosure.
Figure 5D:
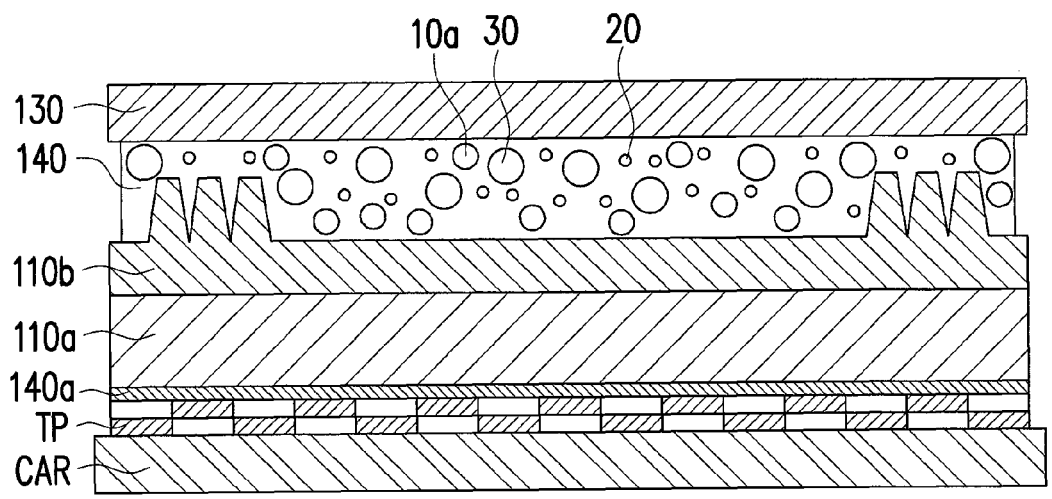
FIG. 5D is a schematic cross-sectional view illustrating a barrier functional film according to a tenth exemplary embodiment of the disclosure.

FIG. 5A is a schematic cross-sectional view illustrating a barrier functional film according to a seventh exemplary embodiment of the disclosure. FIG. 5B is a schematic cross-sectional view illustrating a barrier functional film according to an eighth exemplary embodiment of the disclosure. FIG. 5C is a schematic cross-sectional view illustrating a barrier functional film according to a ninth exemplary embodiment of the disclosure. FIG. 5D is a schematic cross-sectional view illustrating a barrier functional film according to a tenth exemplary embodiment of the disclosure. The barrier functional film 100G depicted in FIG. 5A is similar to the barrier functional film 100C depicted in FIG. 3A, whereas one of the differences therebetween lies in that the barrier functional film 100G depicted in FIG. 5A further includes a touch layer TP that is located on the flexible substrate 110a, and the touch layer TP and the adhesive 140 are respectively located on two opposite sides of the barrier layer 110b The touch layer TP described herein is located between the flexible substrate 110a and the barrier layer 110b. The barrier functional film 100G may further include a flexible carrier CAR that is adhered to the flexible substrate 110a through an optical adhesive (not shown), for instance; therefore, the flexible carrier CAR may be separated from the flexible substrate 110a through a properly exerted force.

The barrier functional film 100H depicted in FIG. 5B is similar to the barrier functional film 100G depicted in FIG. 5A, whereas one of the differences therebetween lies in that the touch layer TP of the barrier functional film 100H depicted in FIG. 5B is adhered to an outer surface of the flexible substrate 110a through a second adhesive 140a, and the flexible carrier CAR of the barrier functional film 100H is adhered to the touch layer TP through an optical adhesive (not shown). Here, the touch layer TP and the adhesive 140 are respectively located on two opposite sides of the flexible substrate 110a, and the touch layer TP is located between the flexible carrier CAR and the second adhesive 140a.

The barrier functional film 100I depicted in FIG. 5C is similar to the barrier functional film 100G depicted in FIG. 5A, whereas one of the differences therebetween lies in that the getter 10a of the barrier functional film 100I depicted in FIG. 5C is distributed in the adhesive 140 in form of particles, for instance. The getter 10a may be a transparent getter or an opaque getter for absorbing moisture and oxygen.

The barrier functional film 100J depicted in FIG. 5D is similar to the barrier functional film 100H depicted in FIG. 5B, whereas one of the differences therebetween lies in that the getter 10a of the barrier functional film 100J depicted in FIG. 5D is distributed in the adhesive 140 in form of particles, for instance. The getter 10a may be a transparent getter or an opaque getter for absorbing moisture and oxygen.

Figure 6A:
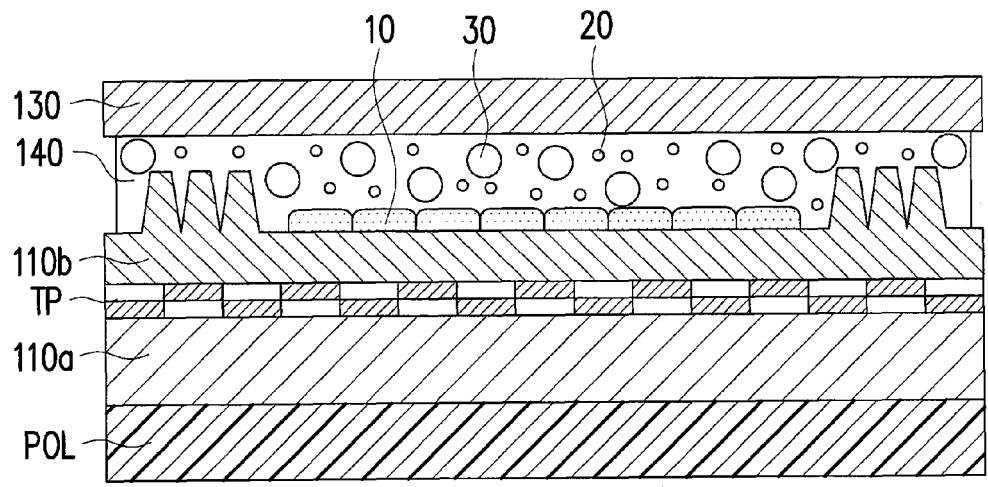
FIG. 6A is a schematic cross-sectional view illustrating a barrier functional film according to an eleventh exemplary embodiment of the disclosure.
Figure 6B:
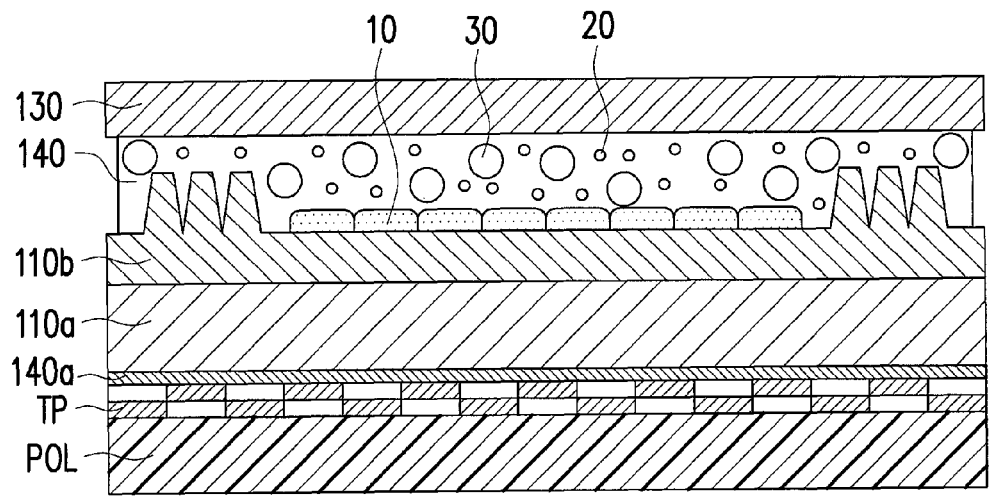
FIG. 6B is a schematic cross-sectional view illustrating a barrier functional film according to a twelfth exemplary embodiment of the disclosure.
Figure 6C:
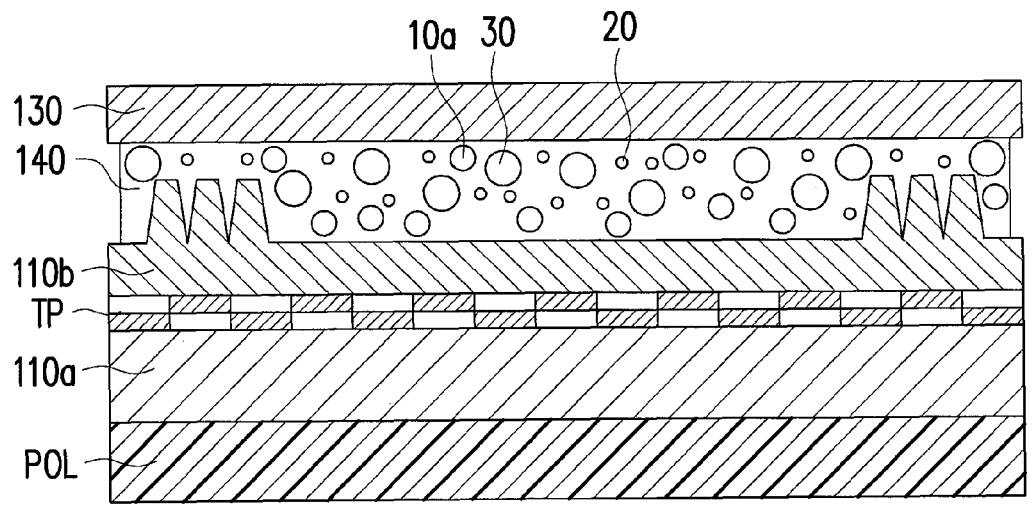
FIG. 6C is a schematic cross-sectional view illustrating a barrier functional film according to a thirteenth exemplary embodiment of the disclosure.
Figure 6D:
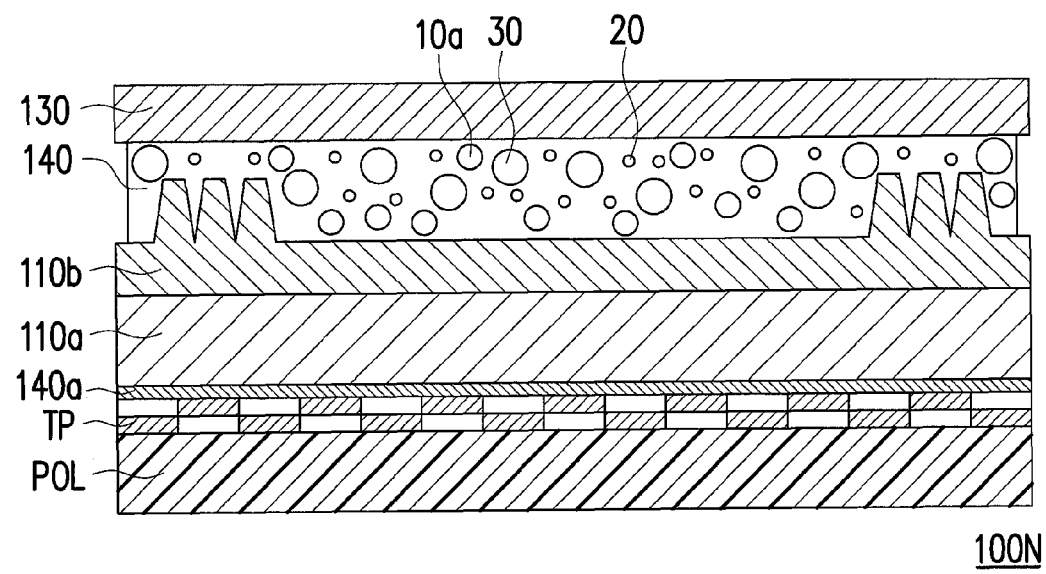
FIG. 6D is a schematic cross-sectional view illustrating a barrier functional film according to a fourteenth exemplary embodiment of the disclosure.

FIG. 6A is a schematic cross-sectional view illustrating a barrier functional film according to an eleventh exemplary embodiment of the disclosure. FIG. 6B is a schematic cross-sectional view illustrating a barrier functional film according to a twelfth exemplary embodiment of the disclosure. FIG. 6C is a schematic cross-sectional view illustrating a barrier functional film according to a thirteenth exemplary embodiment of the disclosure. FIG. 6D is a schematic cross-sectional view illustrating a barrier functional film according to a fourteenth exemplary embodiment of the disclosure. The barrier functional film 100K depicted in FIG. 6A is similar to the barrier functional film 100G depicted in FIG. 5A, whereas one of the differences therebetween lies in that the barrier functional film 100K depicted in FIG. 6A further includes a quarter-wave compensating and polarizing film POL that is located on the flexible substrate 110a. The quarter-wave compensating and polarizing film POL replaces the flexible carrier CAR of the barrier functional film 100G, and the quarter-wave compensating and polarizing film POL and the barrier layer 110b in the barrier functional film 100K are respectively located at two opposite sides of the flexible substrate 110a. The quarter-wave compensating and polarizing film POL refers to a phase retardation film whose retardation has a magnitude of a quarter of a specific wavelength for the wavelength λ, for instance.

The barrier functional film 100L depicted in FIG. 6B is similar to the barrier functional film 100K depicted in FIG. 6A, whereas one of the differences therebetween lies in that the touch layer TP of the barrier functional film 100L depicted in FIG. 6B is adhered to an outer surface of the flexible substrate 110a through a second adhesive 140a, and the quarter-wave compensating and polarizing film POL is located on the touch layer TP. Here, the touch layer TP and the adhesive 140 are respectively located on two opposite sides of the flexible substrate 110a, and the touch layer TP is located between the quarter-wave compensating and polarizing film POL and the second adhesive 140a. The quarter-wave compensating and polarizing film POL refers to a phase retardation film whose retardation has a magnitude of a quarter of a specific wavelength for the wavelength λ, for instance.

The barrier functional film 100M depicted in FIG. 6C is similar to the barrier functional film 100K depicted in FIG. 6A, whereas one of the differences therebetween lies in that the getter 10a of the barrier functional film 100M depicted in FIG. 6C is distributed in the adhesive 140 in form of particles, for instance. The getter 10a may be a transparent getter or an opaque getter for absorbing moisture and oxygen.

The barrier functional film 100N depicted in FIG. 6D is similar to the barrier functional film 100L depicted in FIG. 6B, whereas one of the differences therebetween lies in that the getter 10a of the barrier functional film 100N depicted in FIG. 6D is distributed in the adhesive 140 in form of particles, for instance. The getter 10a may be a transparent getter or an opaque getter for absorbing moisture and oxygen.

Figure 7A:
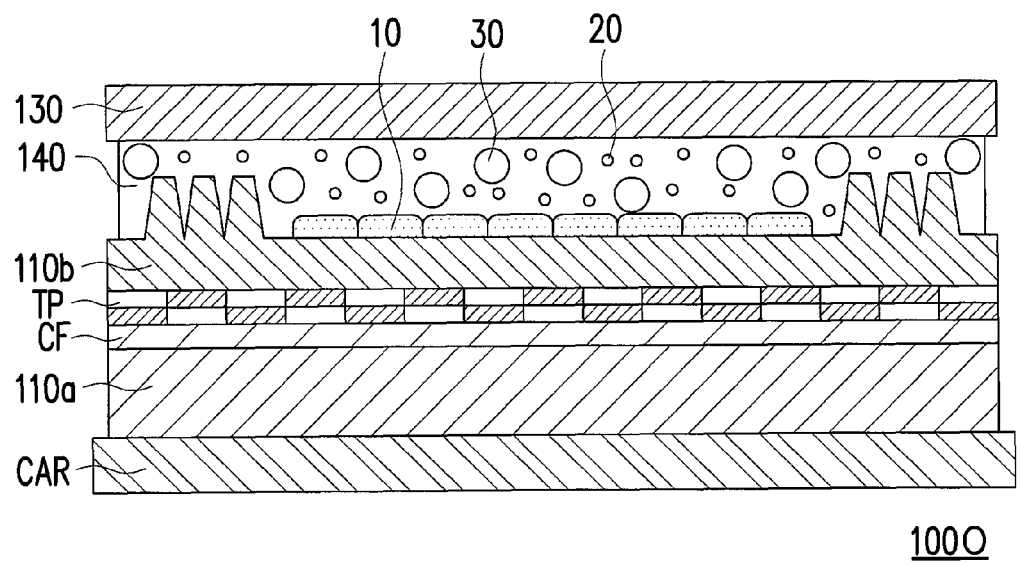
FIG. 7A is a schematic cross-sectional view illustrating a barrier functional film according to a fifteenth exemplary embodiment of the disclosure.
Figure 7B:
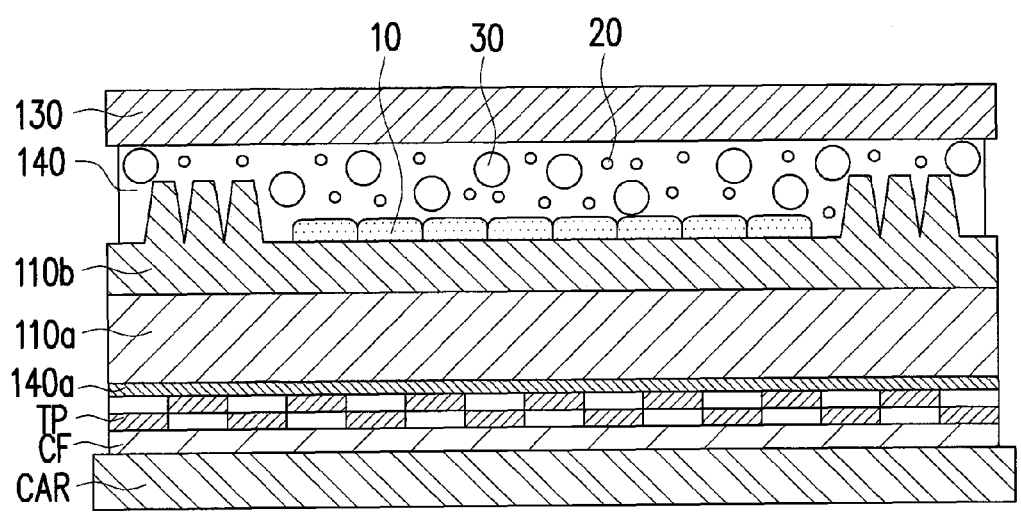
FIG. 7B is a schematic cross-sectional view illustrating a barrier functional film according to a sixteenth exemplary embodiment of the disclosure.
Figure 7C:
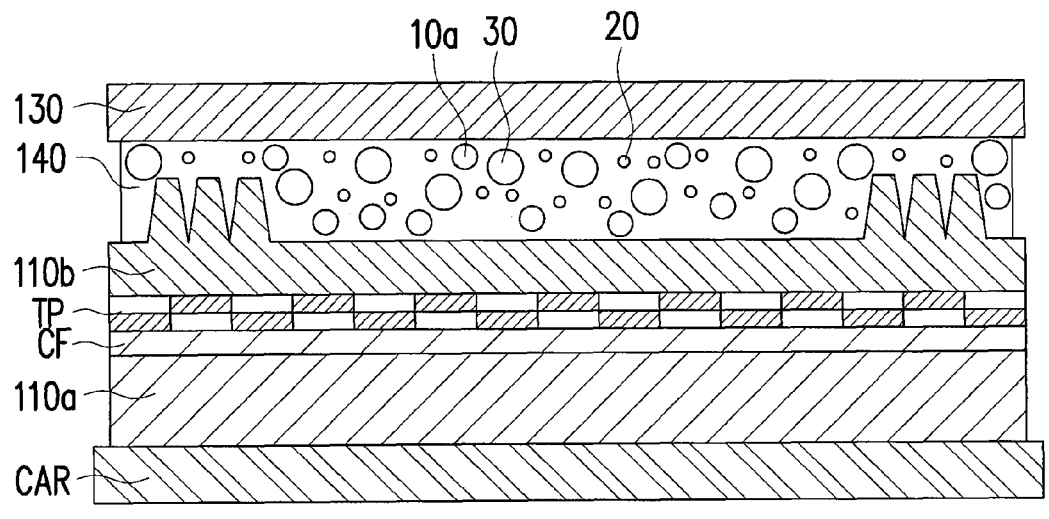
FIG. 7C is a schematic cross-sectional view illustrating a barrier functional film according to a seventeenth exemplary embodiment of the disclosure.
Figure 7D:
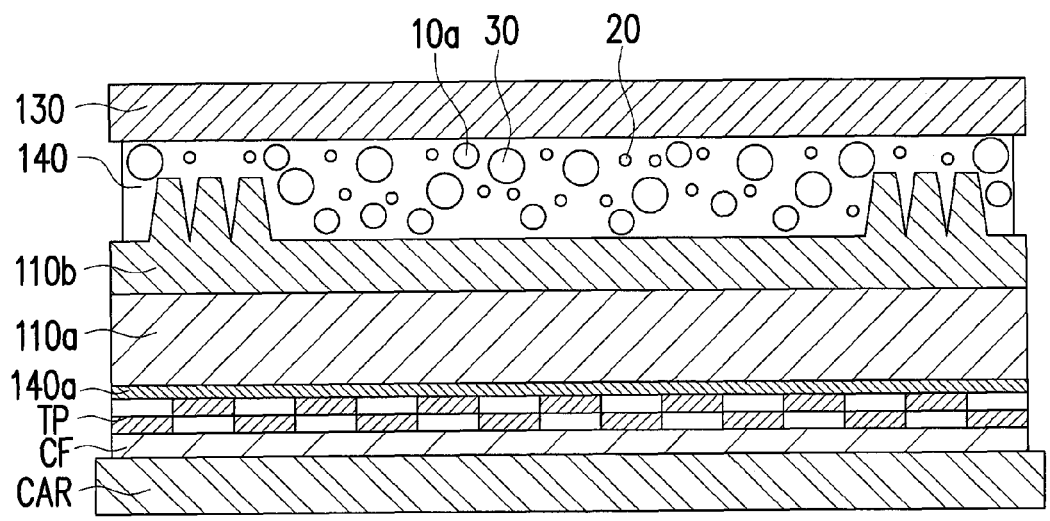
FIG. 7D is a schematic cross-sectional view illustrating a barrier functional film according to an eighteenth exemplary embodiment of the disclosure.

FIG. 7A is a schematic cross-sectional view illustrating a barrier functional film according to a fifteenth exemplary embodiment of the disclosure. FIG. 7B is a schematic cross-sectional view illustrating a barrier functional film according to a sixteenth exemplary embodiment of the disclosure. FIG. 7C is a schematic cross-sectional view illustrating a barrier functional film according to a seventeenth exemplary embodiment of the disclosure. FIG. 7D is a schematic cross-sectional view illustrating a barrier functional film according to an eighteenth exemplary embodiment of the disclosure. The barrier functional film 100O depicted in FIG. 7A is similar to the barrier functional film 100G depicted in FIG. 5A, whereas one of the differences therebetween lies in that the barrier functional film 100O depicted in FIG. 7A further includes a color filter layer CF that is located between the touch layer TP and the flexible substrate 110a, and the color filter layer CF and the barrier layer 110b are respectively located on two opposite sides of the touch layer TP.

The barrier functional film 100P depicted in FIG. 7B is similar to the barrier functional film 100H depicted in FIG. 5B, whereas one of the differences therebetween lies in that the barrier functional film 100P depicted in FIG. 7B further includes a color filter layer CF. The color filter layer CF and the touch layer TP are located on one side of the flexible substrate 110a, and the barrier layer 110b is located on the other side of the flexible substrate 110a.

The barrier functional film 100Q depicted in FIG. 7C is similar to the barrier functional film 100I depicted in FIG. 5C, whereas one of the differences therebetween lies in that the barrier functional film 100Q depicted in FIG. 7C further includes a color filter layer CF that is located between the touch layer TP and the flexible substrate 110a, and the color filter layer CF and the barrier layer 110b are respectively located on two opposite sides of the touch layer TP.

The barrier functional film 100R depicted in FIG. 7D is similar to the barrier functional film 100J depicted in FIG. 5D, whereas one of the differences therebetween lies in that the barrier functional film 100R depicted in FIG. 7D further includes a color filter layer CF that is located between the touch layer TP and the flexible substrate 110a. The color filter layer CF and the touch layer TP are located on one side of the flexible substrate 110a, and the barrier layer 110b is located on the other side of the flexible substrate 110a.

The above descriptions provide some exemplary embodiments of the disclosure, in which the barrier functional films 100A to 100R are exemplified. A manufacturing method of the exemplary barrier functional film 100A depicted in FIG. 1A is elaborated hereinafter with reference to FIG. 8A-1 to FIG. 8D.

Figures 4, 8A:
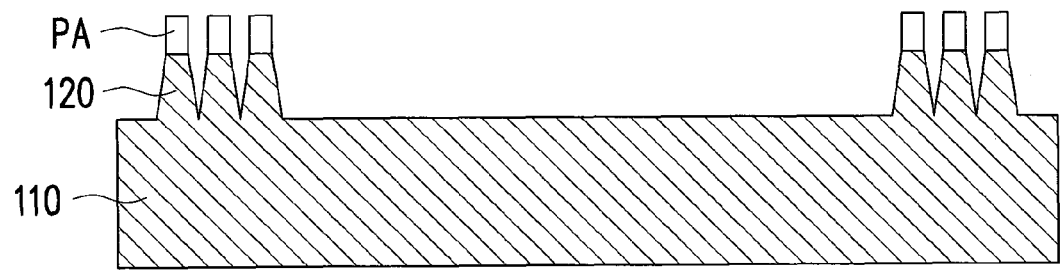
Figures 5, 8A:
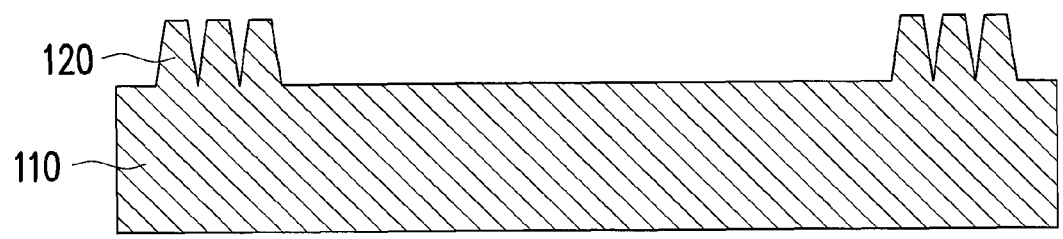
Figure 8B:
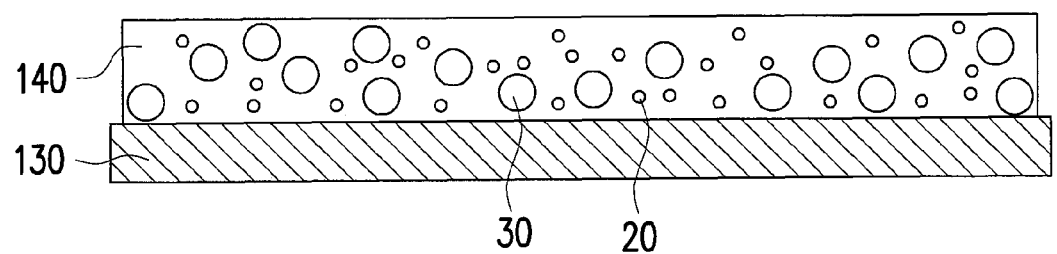
Figure 8C:
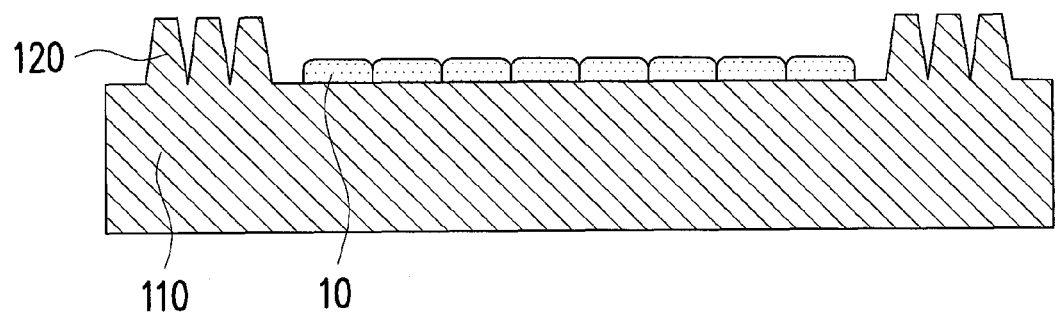
Figure 8D:
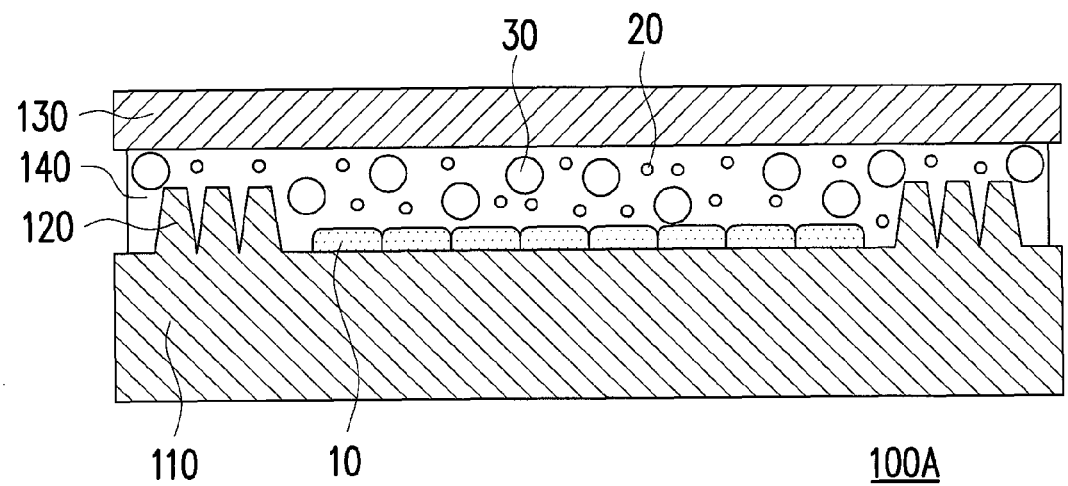

FIG. 8A-1 to FIG. 8D are schematic cross-sectional views illustrating a manufacturing method of a barrier functional film according to an exemplary embodiment of the disclosure. With reference to FIG. 8A-1 to FIG. 8A-5, at least one side wall barrier structure 120 is formed on the substrate 110, and the substrate 110 is a metal substrate or a glass substrate, for instance. As shown in FIG. 8A-1, in a method of forming the at least one side wall barrier structure 120 on the substrate 110, a photoresist layer PR is formed on the substrate 110. As shown in FIG. 8A-2, a photomask PC is placed above the photoresist layer PR; after a projection light L passes through the photomask PC, the photoresist layer PR undergoes an exposure process, so as to achieve pattern transfer. In FIG. 8A-3, a development process is performed on the photoresist layer PR which already undergoes the exposure process, so as to develop the to-be-transferred patterns PA of the photoresist layer PR. In FIG. 8A-4, an etching process is performed on the substrate 110 covered by the photoresist layer PR; a wet etching is performed to remove a portion of the material (with a predetermined thickness) of the substrate 110 that is uncovered by the photoresist layer PR. In FIG. 8A-5, the photoresist layer PR are removed to form the side wall barrier structure 120. The manufacture of the side wall barrier structure 120 is finished. As illustrated in FIG. 1A, the side wall barrier structure 120 described in the present exemplary embodiment is an enclosed structure on the peripheral of barrier functional film 100A, for instance; in FIG. 8A-5, a shape of the cross-section of the side wall barrier structure 120 perpendicular to the substrate 110 is a trapezoidal shape, for instance. In other exemplary embodiments, the shape of the cross-section may be a rectangular shape, a polygonal shape, a circular shape, or an elliptic shape, which should not be construed as limitations to the disclosure.

With reference to FIG. 8B, the adhesive 140 is formed on the releasing film 130. Here, the releasing film 130 is a PET compound or a silicone-containing compound, and the adhesive 140 may be an optical adhesive with certain transmittance. The adhesive 140 described herein may also be an optical adhesive with reflective or transflective properties. The adhesive 140 is made of epoxy resin, an acrylic compound, silicone base resin, etc. According to the present exemplary embodiment, the adhesive 140 is made of a material that may be cured by heat or light; namely, the material of the adhesive 140 is not cured by heat or light, for instance.

The adhesive 140 further includes a heat dissipation auxiliary material 20 that is distributed in the adhesive 140 in form of particles. The heat dissipation auxiliary material 20 has a high heat dissipation coefficient, such as diamond, a diamond-like material, copper, silver, gold, aluminum, platinum, a ceramic material, or an oxide thereof, so as to dissipate heat. The adhesive 140 may also include an anti-electromagnetic interference material 30 that is distributed in the adhesive 140 in form of particles, for instance. The anti-electromagnetic interference material 30 is gold, silver, copper, aluminum, carbon, carbon fiber or lead that may lessen electromagnetic effects.

With reference to FIG. 8C, the releasing film 130 is adhered to the substrate 110 through the adhesive 140. Before the adhesive 140 covers the side wall barrier structure and before the adhesive 140 is formed between the substrate 110 and the releasing film 130, the getter 10 is formed on the substrate 110. Here, the getter 10 is located between the substrate 110 and the adhesive 140 and is surrounded by the side wall barrier structure 120. The getter 10 is a tape getter or an evaporation getter that may serve to absorb moisture and oxygen, for instance. As shown in FIG. 1B, the getter 10 described herein is a tape getter with a rectangular bottom area. In other exemplary embodiments that are not shown in the drawings, the getter 10 may be a sheet-like getter with a polygonal bottom area, a circular bottom area, or an elliptic bottom area, which should not be construed as limitations to the disclosure.

With reference to FIG. 8D, the releasing film 130 is adhered to the substrate 110 through the adhesive 140. The adhesive 140 covers the side wall barrier structure 120 and is located between the substrate 110 and the releasing film 130. After the releasing film 130 is laminated onto the substrate 110, the side wall barrier structure 120 of the substrate 110 may be closely engaged with the releasing film 130 through the adhesive 140 by means of a properly exerted force from a roller or frame press. The manufacturing method of the barrier functional film is completed.

The way to configure the getter 10 on the substrate 110 and the manufacturing method of the getter 10 are not subject to those described in the disclosure; that is, to achieve the effect of absorbing moisture and oxygen, modifications and alterations to the exemplary embodiments described herein may be made without departing from the spirit and scope of the disclosure. For instance, the adhesive 140 shown in FIG. 2A may further has the getter 10a that is distributed in the adhesive 140 in form of particles, and a manufacturing method similar to that of the barrier functional film 100A may be performed to for the barrier functional film 100B.

The manufacturing methods and the structures of the aforesaid barrier functional films may be identical or similar. The difference between the manufacturing method of the barrier functional film 100A and the manufacturing methods of the barrier functional films 100C to 100R are explained hereinafter, and the same features of the same components will not be further described below.

The manufacturing method of the barrier functional film 100C in FIG. 3A may be identical to the manufacturing method of the barrier functional film 100A, while one of the differences therebetween lies in that the substrate 110 of the barrier functional film 100C shown in FIG. 3A may further include the flexible substrate 110a and the barrier layer 110b. The barrier layer 110b is made of a single-layered or multi-layered inorganic material, such as $SiN_x$, $SiO_x$, $SiN_xO_y$, or $Al_2O_3$. The barrier layer 110b may also be made of a hybrid organic-inorganic material, e.g., Si—C polymer. Alternatively, the barrier layer 110b may be a stacked layer containing multiple organic and inorganic material layers, and the organic material may be acrylic, epoxy resin, parylene, or the like The inorganic material may be formed on the flexible substrate 110a through CVD or sputtering. The hybrid organic-inorganic material may be formed on the flexible substrate 110a through CVD. The organic material may be formed on the flexible substrate 110a through CVD, spraying, or coating. The barrier layer 110b formed on the flexible substrate 110a through applying said manufacturing method and using said materials can serve to block external moisture or oxygen.

The barrier layer 110b formed on the flexible substrate 110a may have a single-layered barrier structure for blocking external moisture and oxygen; in another exemplary embodiment, the barrier layer 110b may also have a barrier structure containing two or more film layers, which should not be construed as a limitation to the disclosure.

The manufacturing method of the barrier functional film 100D in FIG. 3B may be identical to the manufacturing method of the barrier functional film 100C in FIG. 3A, whereas one of the differences therebetween lies in that the barrier functional film 100D depicted in FIG. 3B is equipped with a getter 10a'. The getter 10a' is distributed in the adhesive 140 in form of particles for absorbing moisture and oxygen, for instance.

The manufacturing method of the barrier functional film 100E in FIG. 4A may be identical to the manufacturing method of the barrier functional film 100C in FIG. 3A, whereas one of the differences therebetween lies in that a quarter-wave compensating and polarizing film POL is further formed on the flexible substrate 110a of the barrier functional film 100E depicted in FIG. 4A, and the quarter-wave compensating and polarizing film POL and the barrier layer 110b in the barrier functional film 100E are respectively located at two opposite sides of the flexible substrate 110a.

The manufacturing method of the barrier functional film 100F in FIG. 4B may be identical to the manufacturing method of the barrier functional film 100D in FIG. 3B, whereas one of the differences therebetween lies in that a quarter-wave compensating and polarizing film POL is further formed on the flexible substrate 110a of the barrier functional film 100F depicted in FIG. 4B, and the quarter-wave compensating and polarizing film POL and the barrier layer 110b in the barrier functional film 100E are respectively located at two opposite sides of the flexible substrate 110a.

The manufacturing method of the barrier functional film 100G in FIG. 5A may be identical to the manufacturing method of the barrier functional film 100C in FIG. 3A, whereas one of the differences therebetween lies in that a touch layer TP is further formed on the flexible substrate 110a of the barrier functional film 100G before the barrier layer 110b is adhered onto the flexible substrate 110a, and the touch layer TP and the adhesive 140 are respectively located on two opposite sides of the barrier layer 110b. A flexible carrier CAR is further formed on the flexible substrate 110a. Here, the flexible carrier CAR is adhered to the flexible substrate 110a through an optical adhesive (not shown), for instance; therefore, the flexible carrier CAR may be separated from the flexible substrate 110a through a properly exerted force.

The manufacturing method of the barrier functional film 100H in FIG. 5B may be identical to the manufacturing method of the barrier functional film 100G in FIG. 5A, whereas one of the differences therebetween lies in that the touch layer TP of the barrier functional film 100H depicted in FIG. 5A is formed on an outer surface of the flexible substrate 110a. The touch layer TP is adhered to the flexible substrate 110a through the second adhesive 140a. The flexible carrier CAR is then adhered to the flexible substrate 110a through an optical adhesive (not shown), for instance. Here, the touch layer TP and the adhesive 140 are respectively located on two opposite sides of the flexible substrate 110a, and the touch layer TP is located between the flexible carrier CAR and the adhesive 140.

The manufacturing method of the barrier functional film 100I in FIG. 5C may be identical to the manufacturing method of the barrier functional film 100G in FIG. 5A, whereas one of the differences therebetween lies in that the getter 10a is configured in the adhesive 140 of the barrier functional film 100I depicted in FIG. 5C. The getter 10a is distributed in the adhesive 140 in form of particles for absorbing moisture and oxygen, for instance.

The manufacturing method of the bather functional film 100J in FIG. 5D may be identical to the manufacturing method of the barrier functional film 100H in FIG. 5B, whereas one of the differences therebetween lies in that the getter 10a is configured in the adhesive 140 of the barrier functional film 100J depicted in FIG. 5D. The getter 10a is distributed in the adhesive 140 in form of particles for absorbing moisture and oxygen, for instance.

The manufacturing method of the barrier functional film 100K in FIG. 6A may be identical to the manufacturing method of the barrier functional film 100G in FIG. 5A, whereas one of the differences therebetween lies in that the quarter-wave compensating and polarizing film POL is further formed on the flexible substrate 110a of the barrier functional film 100K depicted in FIG. 6A. The quarter-wave compensating and polarizing film POL replaces the flexible carrier CAR of the barrier functional film 100G, and the quarter-wave compensating and polarizing film POL and the barrier layer 110b in the barrier functional film 100K are respectively located at two opposite sides of the flexible substrate 110a.

The manufacturing method of the barrier functional film 100L in FIG. 6B may be identical to the manufacturing method of the barrier functional film 100H in FIG. 5B, whereas one of the differences therebetween lies in that the quarter-wave compensating and polarizing film POL is further formed on the touch layer TP of the barrier functional film 100L depicted in FIG. 6B. The quarter-wave compensating and polarizing film POL replaces the flexible carrier CAR of the barrier functional film 100H, the touch layer TP and the adhesive 140 are respectively located at two opposite sides of the flexible substrate 110a, and the touch layer TP is located between the quarter-wave compensating and polarizing film POL and the adhesive 140a.

The manufacturing method of the barrier functional film 100M in FIG. 6C is substantially identical to the manufacturing method of the barrier functional film 100K in FIG. 6A, whereas one of the differences therebetween lies in that the getter 10 is configured in the adhesive 140 of the barrier functional film 100M depicted in FIG. 6C. The getter 10a is distributed in the adhesive 140 in form of particles for absorbing moisture and oxygen, for instance.

The manufacturing method of the barrier functional film 100N in FIG. 6D may be identical to the manufacturing method of the barrier functional film 100L in FIG. 6B, whereas one of the differences therebetween lies in that the getter 10a is configured in the adhesive 140 of the barrier functional film 100N depicted in FIG. 6D. The getter 10a is distributed in the adhesive 140 in form of particles for absorbing moisture and oxygen, for instance.

The manufacturing method of the barrier functional film 100O in FIG. 7A may be identical to the manufacturing method of the barrier functional film 100G in FIG. 5A, whereas one of the differences therebetween lies in that a color filter layer CF is formed on the flexible substrate 110a of the barrier functional film 100O, and the touch layer TP is further formed on the color filter layer CF of the barrier functional film 100O. Here, the color filter layer CF is located between the flexible substrate 110a and the touch layer TP, and the color filter layer CF and the barrier layer 110b are respectively located on two opposite sides of the touch layer TP.

The manufacturing method of the barrier functional film 100P in FIG. 7B may be identical to the manufacturing method of the barrier functional film 100H in FIG. 5B, whereas one of the differences therebetween lies in that the color filter layer CF is formed on the touch layer TP of the barrier functional film 100P, and the color filter layer CF and the barrier layer 110b are respectively located on two opposite sides of the touch layer TP. The flexible carrier CAR is then adhered to the touch layer TP through an optical adhesive (not shown), for instance. Here, the flexible carrier CAR and the touch layer TP are respectively located on two opposite sides of the color filter layer CF.

The manufacturing method of the barrier functional film 100Q in FIG. 7C may be identical to the manufacturing method of the barrier functional film 100I in FIG. 5C, whereas one of the differences therebetween lies in that a color filter layer CF is formed on the touch layer TP of the barrier functional film 100Q, and the flexible substrate 110a is further formed on the color filter layer CF of the barrier functional film 100Q. Here, the color filter layer CF is located between the flexible substrate 110a and the touch layer TP, and the color filter layer CF and the barrier layer 110b are respectively located on two opposite sides of the touch layer TP.

The manufacturing method of the barrier functional film 100R in FIG. 7D may be identical to the manufacturing method of the barrier functional film 100J in FIG. 5D, whereas one of the differences therebetween lies in that the color filter layer CF is formed on the touch layer TP of the barrier functional film 100R, and the color filter layer CF and the barrier layer 110b are respectively located on two opposite sides of the touch layer TP. The flexible carrier CAR is then adhered to the color filter layer CF through an optical adhesive (not shown), for instance. Here, the flexible carrier CAR and the touch layer TP are respectively located on two opposite sides of the color filter layer CF.

Figure 9:
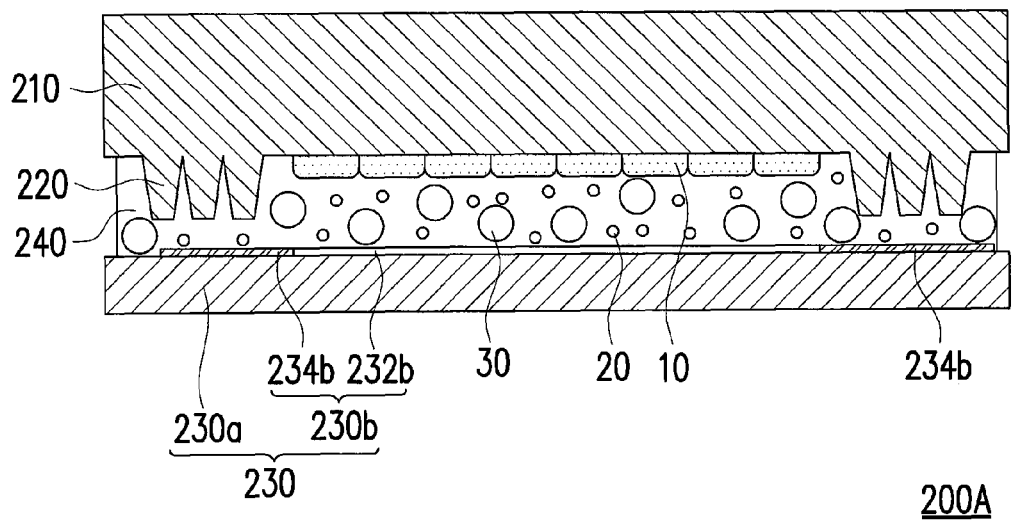
FIG. 9 is a schematic cross-sectional view illustrating an environmental sensitive electronic device according to the first exemplary embodiment of the disclosure.

FIG. 9 is a schematic cross-sectional view illustrating an environmental sensitive electronic device according to the first exemplary embodiment of the disclosure. With reference to FIG. 9, the environmental sensitive electronic device 200A described in the present exemplary embodiment includes a first substrate 210, at least one first side wall barrier structure 220, an environmental sensitive electronic device back plate 230, and a first adhesive 240. The first side wall barrier structure 220 is located on the first substrate 210. The first substrate 210 is located above the environmental sensitive electronic device back plate 230, and the first side wall barrier structure 220 is located between the first substrate 210 and the environmental sensitive electronic device back plate 230. The first adhesive 240 is located between the first substrate 210 and the environmental sensitive electronic device back plate 230 and covers the first side wall barrier structure 220. The first substrate 210 and the first side wall barrier structure 220 are adhered to the environmental sensitive electronic device back plate 230 through the first adhesive 240.

After the releasing film 130 of the barrier functional film 100A shown in FIG. 1A is torn off, the substrate 110 and the side wall barrier structure 120 are adhered to the environmental sensitive electronic device back plate 230 through the adhesive 140 to form the environmental sensitive electronic device 200A. After the substrate 110 is laminated onto the environmental sensitive electronic device back plate 230, the side wall barrier structure 120 of the substrate 110 may be closely engaged with the environmental sensitive electronic device back plate 230 through the adhesive 140 by means of a properly exerted force from a roller, flat-head press, cushion press, and so on. After the substrate 110 is laminated onto the environmental sensitive electronic device back plate 230 through the adhesive 140, the substrate 110 then becomes the first substrate 210, and the side wall barrier structure 120 becomes the first side wall barrier structure 220. After that, the adhesive 140 is cured (by heat or ultraviolet light) to form the first adhesive 240. Through the first adhesive 240 and the environmental sensitive electronic device back plate 230, the first substrate 210 and the first side wall barrier structure 220 can be firmly engaged with each other.

In the present exemplary embodiment, the environmental sensitive electronic device back plate 230 may include a flexible base material 230a and a plurality of environmental sensitive electronic device units 230b arranged on the flexible base material 230a. The flexible base material 230a may be made of PI or may be any other flexible material. Each of the environmental sensitive electronic device units 230b includes an active device 232b and a circuit wire 234b, and the circuit wire 234b is electrically connected to the active device 232b. In the present exemplary embodiment, the active device 232b is, for instance, an active environmental sensitive electronic display device. The active environmental sensitive electronic display device is, for instance, an active matrix organic light emitting diode (AM-OLED), an active matrix electrophoretic display (AM-EPD) commonly known as electronic paper, an active matrix liquid crystal display (AM-LCD), or an active matrix blue phase liquid crystal display (AMBPLCD).

The active device 232b includes a thin film transistor (TFT, not shown), and the TFT may be amorphous TFT (a-Si TFT), metal oxide TFT, or polysilicon TFT (p-Si TFT). The p-Si TFT may further include a low-temperature p-Si TFT, a high-temperature p-Si TFT, a continuous grain silicon TFT (CGS TFT), a super grain silicon TFT (SGS TFT), and so forth.

The first adhesive 240 further may include a heat dissipation auxiliary material 20 that is distributed in the first adhesive 140 in form of particles. The heat dissipation auxiliary material 20 has a high heat dissipation coefficient, such as diamond, a diamond-like material, copper, silver, gold, aluminum, platinum, a ceramic material, or an oxide thereof, so as to dissipate heat. The first adhesive 240 may also include an anti-electromagnetic interference material 30 that is distributed in the first adhesive 140 in form of particles, for instance. The anti-electromagnetic interference material 30 is gold, silver, copper, aluminum, carbon, carbon fiber or lead that may lessen electromagnetic effects.

The environmental sensitive electronic device 200A is formed by engaging the environmental sensitive electronic device back plate 230 with the barrier functional film 100A of which the releasing film 130 is torn off. In other exemplary embodiments, however, any different structural design or configuration of the combined environmental sensitive electronic device back plate 230 and each of the barrier functional film 100B to 100R which may prevent moisture infiltration and oxygen diffusion is still deemed an applicable technical scheme and falls within the scope of protection provided in the disclosure. The following are descriptions of different exemplary embodiments detailing different designs of environmental sensitive electronic devices 200B to 200R.

Figure 10:
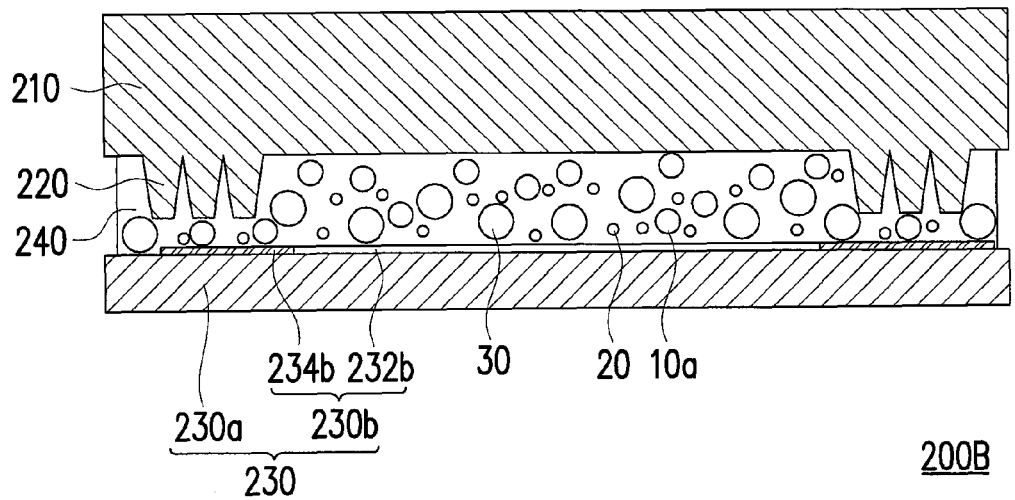
FIG. 10 is a schematic cross-sectional view illustrating an environmental sensitive electronic device according to the second exemplary embodiment of the disclosure.

FIG. 10 is a schematic cross-sectional view illustrating an environmental sensitive electronic device according to the second exemplary embodiment of the disclosure. The environmental sensitive electronic device 200B depicted in FIG. 10 is similar to the environmental sensitive electronic device 200A depicted in FIG. 9, whereas one of the differences therebetween lies in that the getter 10a of the environmental sensitive electronic device 200B depicted in FIG. 10 is distributed in the first adhesive 240 in form of particles, for instance. In most cases, the getter 10a may be a transparent getter or an opaque getter for absorbing moisture and oxygen.

Figure 11A:
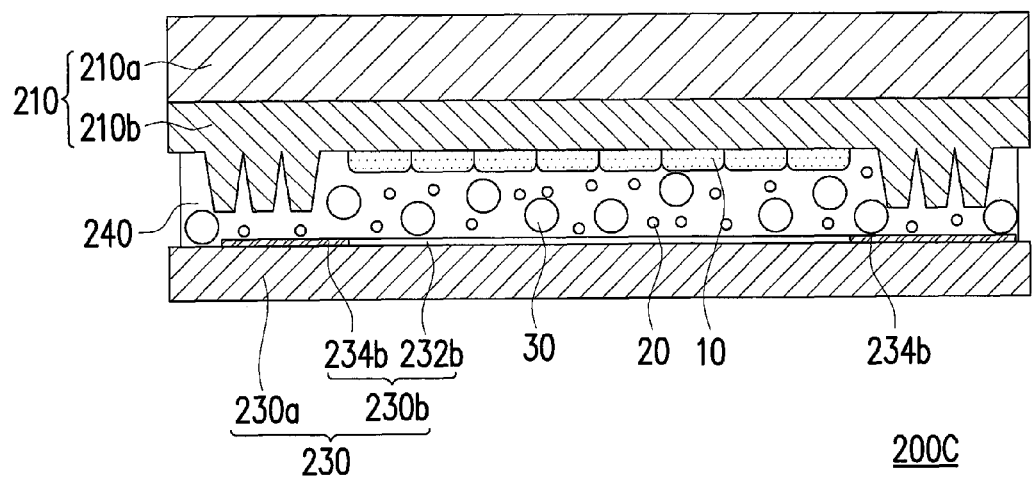
FIG. 11A is a schematic cross-sectional view illustrating an environmental sensitive electronic device according to the third exemplary embodiment of the disclosure.
Figure 11B:
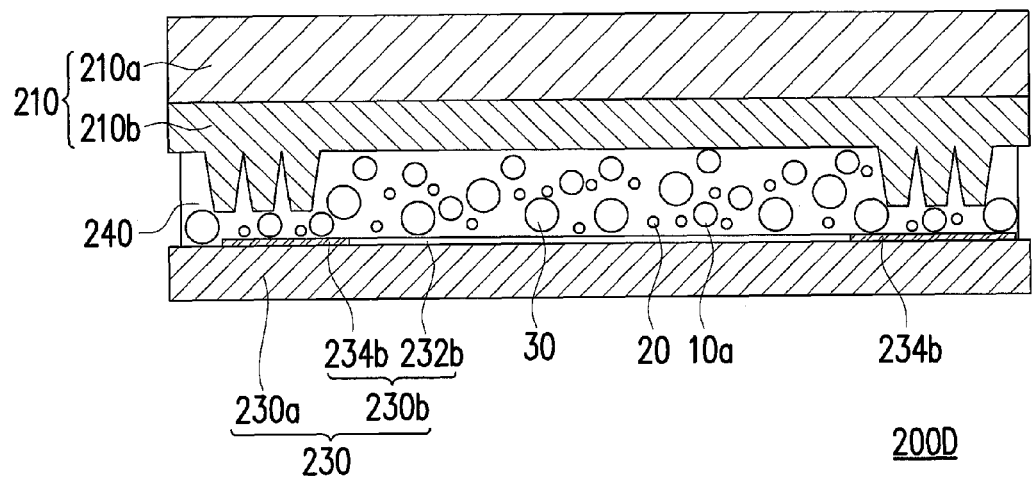
FIG. 11B is a schematic cross-sectional view illustrating an environmental sensitive electronic device according to the fourth exemplary embodiment of the disclosure.

FIG. 11A is a schematic cross-sectional view illustrating an environmental sensitive electronic device according to the third exemplary embodiment of the disclosure. FIG. 11B is a schematic cross-sectional view illustrating an environmental sensitive electronic device according to the fourth exemplary embodiment of the disclosure. The environmental sensitive electronic device 200C depicted in FIG. 11A is similar to the environmental sensitive electronic device 200A depicted in FIG. 9, whereas one of the differences therebetween lies in that the first substrate 210 of the environmental sensitive electronic device 200C shown in FIG. 11A may further include a flexible substrate 210a and a barrier layer 210b. The flexible substrate 210a may be made of PI, PET, PEN, PES, PMMA, PC, metal foil, or ultra thin glass.

The barrier layer 210b is located on the flexible substrate 210a and is made of a single-layered or multi-layered inorganic material, such as $SiN_x$, $SiO_x$, $SiN_xO_y$, or $Al_2O_3$; the barrier layer 210b may also be made of a hybrid organic-inorganic material, e.g., Si—C polymer. Alternatively, the barrier layer 210b may be a stacked layer containing multiple organic and inorganic material layers, and the organic material may be acrylic, epoxy resin, parylene, or the like. The inorganic material may be formed through CVD or sputtering; the hybrid organic-inorganic material may be formed through CVD; the organic material may be formed through CVD, spraying, or coating, so as to block external moisture and oxygen.

The environmental sensitive electronic device 200D depicted in FIG. 11B is similar to the environmental sensitive electronic device 200C depicted in FIG. 11A, whereas one of the differences therebetween lies in that the getter 10a of the environmental sensitive electronic device 200D depicted in FIG. 11B is distributed in the first adhesive 240 in form of particles, for instance. In most cases, the getter 10a may be a transparent getter or an opaque getter for absorbing moisture and oxygen.

Figure 12A:
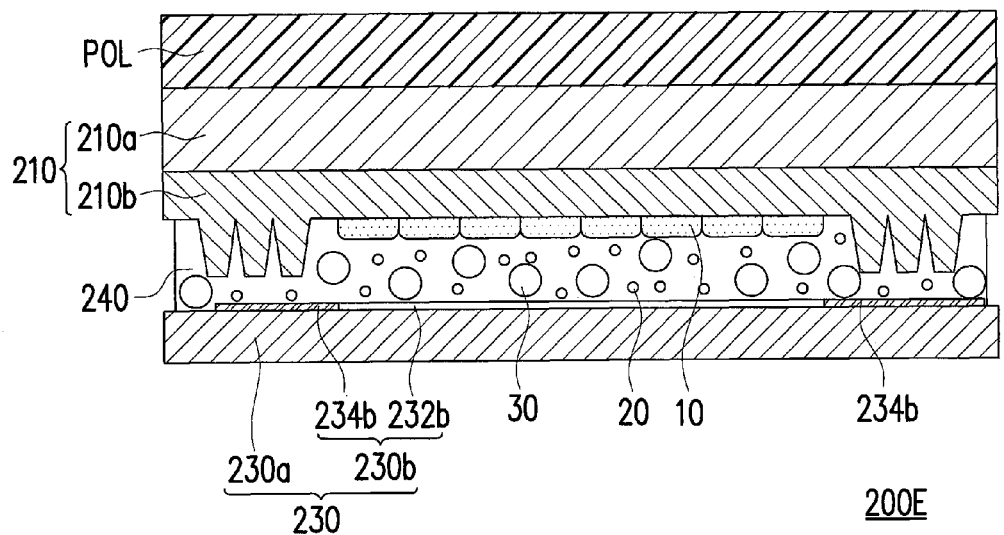
FIG. 12A is a schematic cross-sectional view illustrating an environmental sensitive electronic device according to the fifth exemplary embodiment of the disclosure.
Figure 12B:
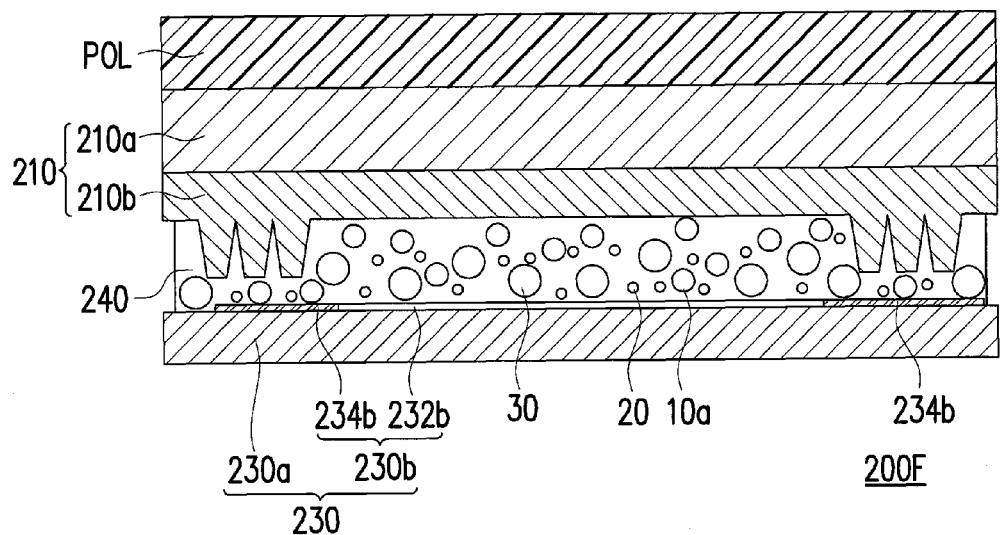
FIG. 12B is a schematic cross-sectional view illustrating an environmental sensitive electronic device according to the sixth exemplary embodiment of the disclosure.

FIG. 12A is a schematic cross-sectional view illustrating an environmental sensitive electronic device according to the fifth exemplary embodiment of the disclosure. FIG. 12B is a schematic cross-sectional view illustrating an environmental sensitive electronic device according to the sixth exemplary embodiment of the disclosure. The environmental sensitive electronic device 200E depicted in FIG. 12A is similar to the environmental sensitive electronic device 200C depicted in FIG. 11A, whereas one of the differences therebetween lies in that the environmental sensitive electronic device 200E depicted in FIG. 12A further includes a quarter-wave compensating and polarizing film POL that is located on the flexible substrate 210a, and the quarter-wave compensating and polarizing film POL and the barrier layer 210b are respectively located at two opposite sides of the flexible substrate 210a. The quarter-wave compensating and polarizing film POL refers to a phase retardation film whose retardation has a magnitude of a quarter of a specific wavelength for the wavelength λ, for instance.

The environmental sensitive electronic device 200F depicted in FIG. 12B is similar to the environmental sensitive electronic device 200E depicted in FIG. 12A, whereas one of the differences therebetween lies in that the getter 10a of the environmental sensitive electronic device 200F depicted in FIG. 12B is distributed in the first adhesive 240 in form of particles, for instance. In most cases, the getter 10a may be a transparent getter or an opaque getter for absorbing moisture and oxygen.

Figure 13A:
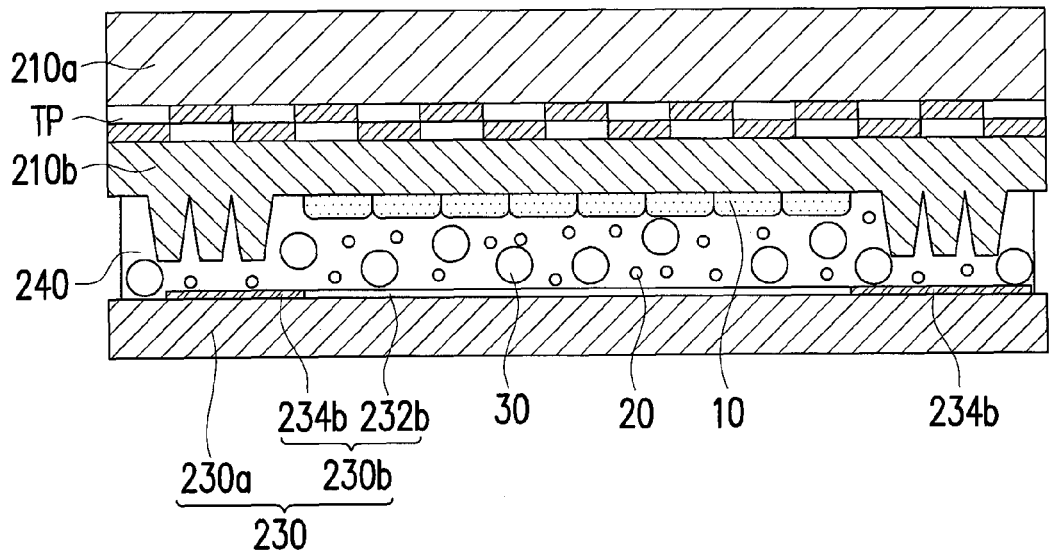
FIG. 13A is a schematic cross-sectional view illustrating an environmental sensitive electronic device according to the seventh exemplary embodiment of the disclosure.
Figure 13B:
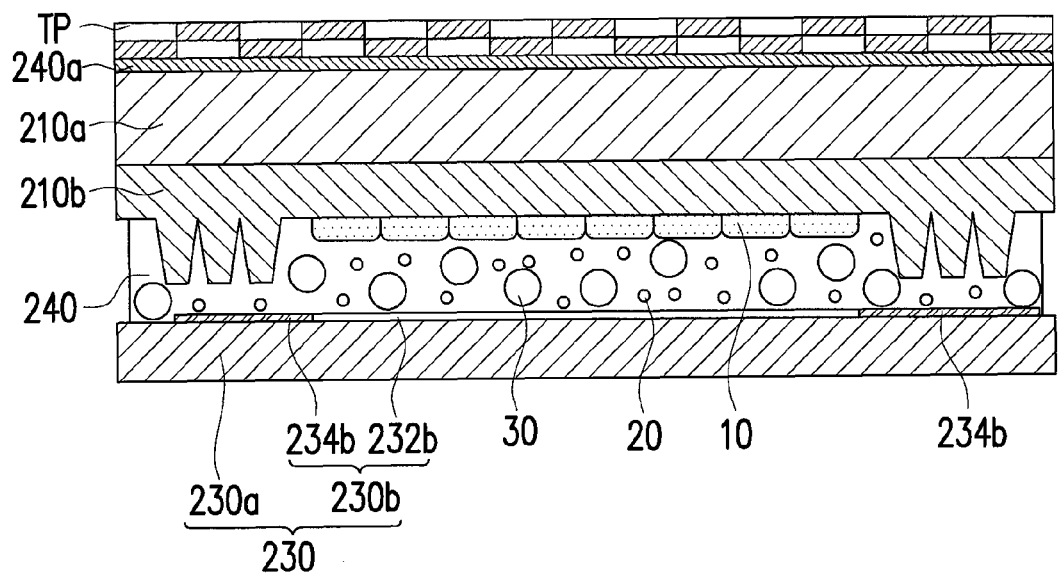
FIG. 13B is a schematic cross-sectional view illustrating an environmental sensitive electronic device according to the eighth exemplary embodiment of the disclosure.
Figure 13C:
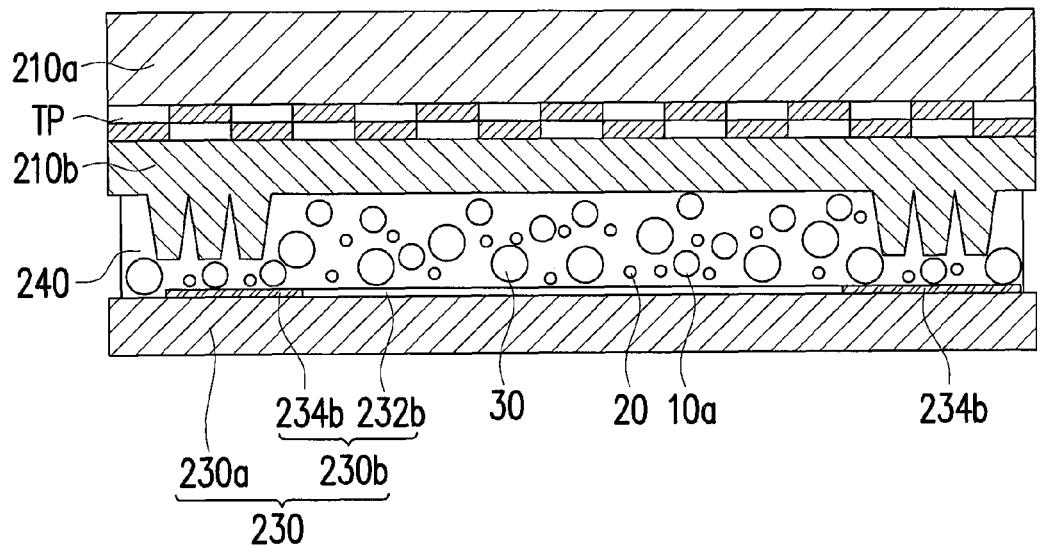
FIG. 13C is a schematic cross-sectional view illustrating an environmental sensitive electronic device according to the ninth exemplary embodiment of the disclosure.
Figure 13D:
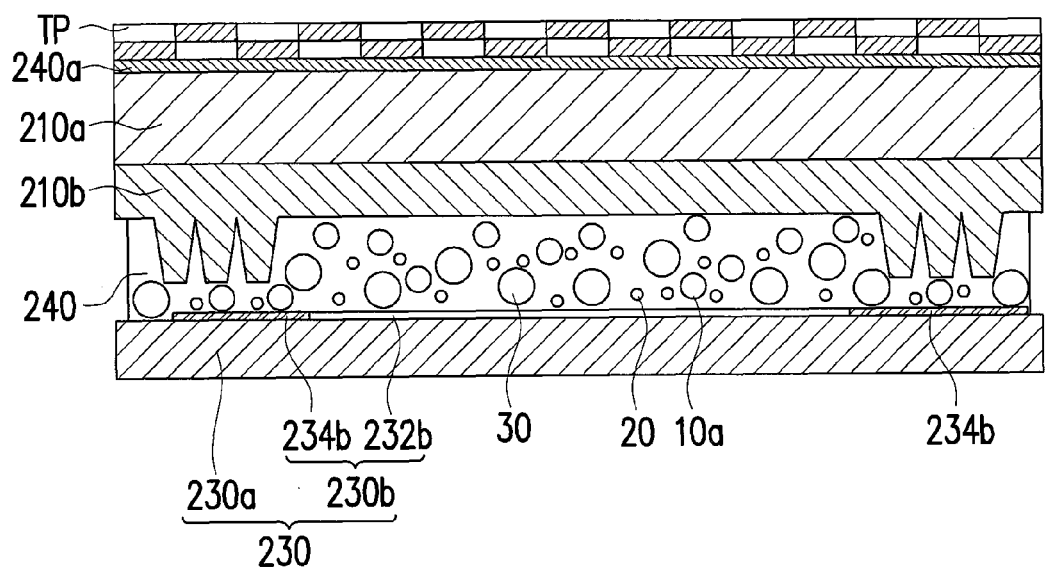
FIG. 13D is a schematic cross-sectional view illustrating an environmental sensitive electronic device according to the tenth exemplary embodiment of the disclosure.

FIG. 13A is a schematic cross-sectional view illustrating an environmental sensitive electronic device according to the seventh exemplary embodiment of the disclosure. FIG. 13B is a schematic cross-sectional view illustrating an environmental sensitive electronic device according to the eighth exemplary embodiment of the disclosure. FIG. 13C is a schematic cross-sectional view illustrating an environmental sensitive electronic device according to the ninth exemplary embodiment of the disclosure. FIG. 13D is a schematic cross-sectional view illustrating an environmental sensitive electronic device according to the tenth exemplary embodiment of the disclosure. The environmental sensitive electronic device 200G depicted in FIG. 13A is similar to the environmental sensitive electronic device 200C depicted in FIG. 11A, whereas one of the differences therebetween lies in that the environmental sensitive electronic device 200G depicted in FIG. 13A further includes a touch layer TP that is located on the flexible substrate 210a, and the touch layer TP and the first adhesive 240 are respectively located on two opposite sides of the barrier layer 210b. After the releasing film 130 of the barrier functional film 100G is torn off, the substrate 110 and the side wall barrier structure 120 are adhered to the environmental sensitive electronic device back plate 230 through the adhesive 140, and the flexible carrier CAR is further torn off, so as to form the environmental sensitive electronic device 200G. After the substrate 110 is laminated onto the environmental sensitive electronic device back plate 230, the substrate 110 then becomes the first substrate 210, and the side wall barrier structure 120 becomes the first side wall barrier structure 220. After that, the adhesive 140 is cured (by heat or ultraviolet light) to form the first adhesive 240. Through the first adhesive 240 and the environmental sensitive electronic device back plate 230, the first substrate 210 and the first side wall barrier structure 220 may be firmly engaged with each other.

The environmental sensitive electronic device 200H depicted in FIG. 13B is similar to the environmental sensitive electronic device 200G depicted in FIG. 13A, whereas one of the differences therebetween lies in that the touch layer TP of the environmental sensitive electronic device 200H depicted in FIG. 13B is adhered to an outer surface of the flexible substrate 210a through a third adhesive 240a, and the touch layer TP and the first adhesive 240 are respectively located on two opposite sides of the flexible substrate 210a.

The environmental sensitive electronic device 200I depicted in FIG. 13C is similar to the environmental sensitive electronic device 200G depicted in FIG. 13A, whereas one of the differences therebetween lies in that the getter 10a of the environmental sensitive electronic device 200I depicted in FIG. 13C is distributed in the first adhesive 240 in form of particles, for instance. The getter 10a may be a transparent getter or an opaque getter for absorbing moisture and oxygen.

The environmental sensitive electronic device 200J depicted in FIG. 13D is similar to the environmental sensitive electronic device 200H depicted in FIG. 13B, whereas one of the differences therebetween lies in that the getter 10a of the environmental sensitive electronic device 200J depicted in FIG. 13D is distributed in the first adhesive 240 in form of particles, for instance. The getter 10a may be a transparent getter or an opaque getter for absorbing moisture and oxygen.

Figure 14A:
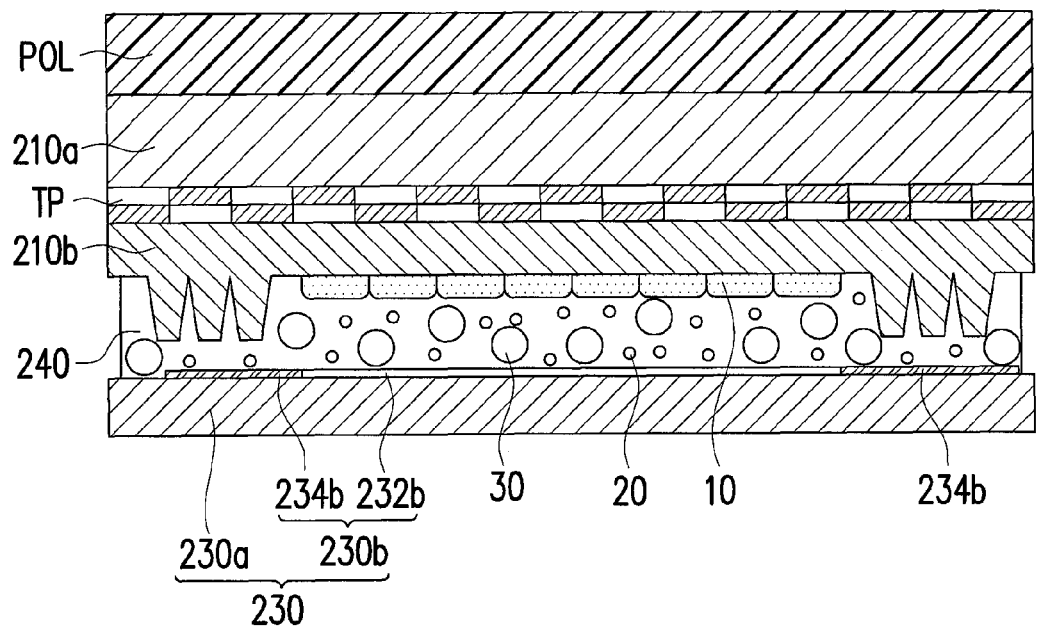
FIG. 14A is a schematic cross-sectional view illustrating an environmental sensitive electronic device according to the eleventh exemplary embodiment of the disclosure.
Figure 14B:
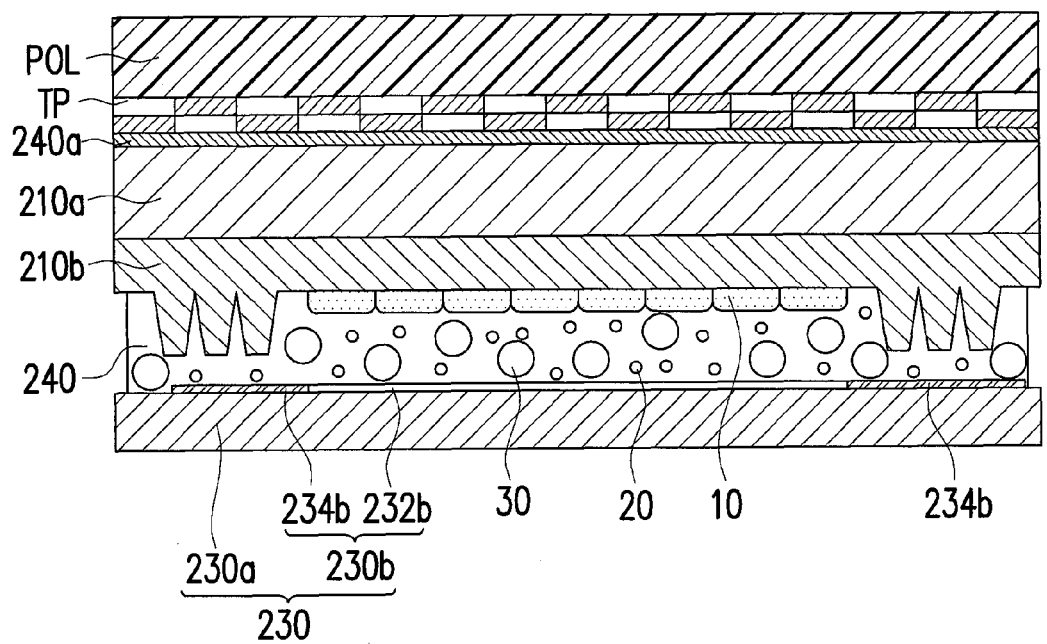
FIG. 14B is a schematic cross-sectional view illustrating an environmental sensitive electronic device according to the twelfth exemplary embodiment of the disclosure.
Figure 14C:
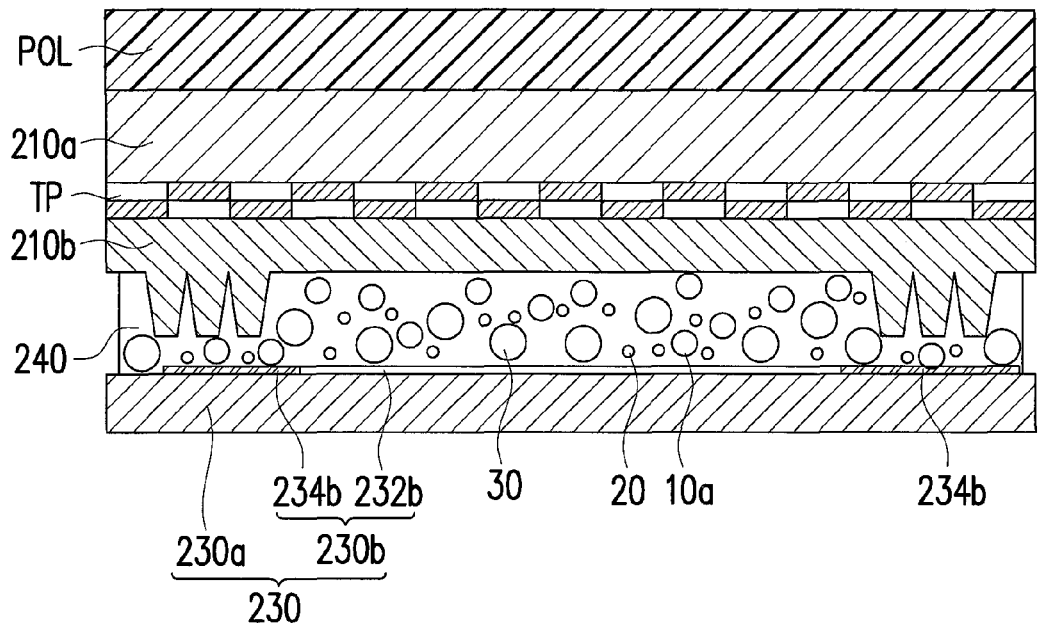
FIG. 14C is a schematic cross-sectional view illustrating an environmental sensitive electronic device according to the thirteenth exemplary embodiment of the disclosure.
Figure 14D:
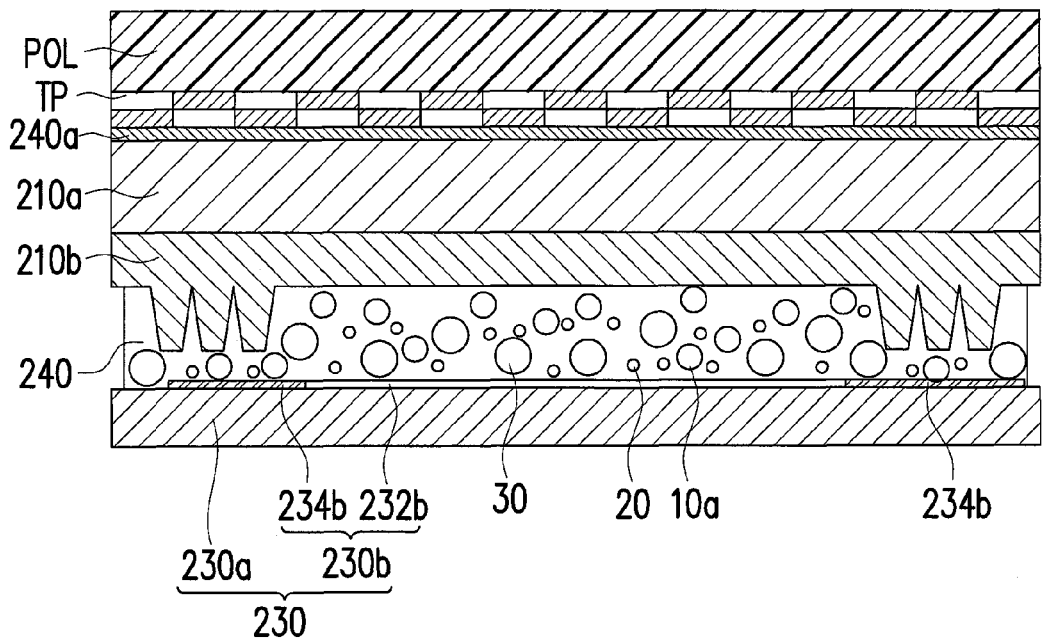
FIG. 14D is a schematic cross-sectional view illustrating an environmental sensitive electronic device according to the fourteenth exemplary embodiment of the disclosure.

FIG. 14A is a schematic cross-sectional view illustrating an environmental sensitive electronic device according to the eleventh exemplary embodiment of the disclosure. FIG. 14B is a schematic cross-sectional view illustrating an environmental sensitive electronic device according to the twelfth exemplary embodiment of the disclosure. FIG. 14C is a schematic cross-sectional view illustrating an environmental sensitive electronic device according to the thirteenth exemplary embodiment of the disclosure. FIG. 14D is a schematic cross-sectional view illustrating an environmental sensitive electronic device according to the fourteenth exemplary embodiment of the disclosure. The environmental sensitive electronic device 200K depicted in FIG. 14A is similar to the environmental sensitive electronic device 200G depicted in FIG. 13A, whereas one of the differences therebetween lies in that the environmental sensitive electronic device 200K depicted in FIG. 14A further includes a quarter-wave compensating and polarizing film POL that is located on the flexible substrate 210a, and the quarter-wave compensating and polarizing film POL and the barrier layer 210b are respectively located at two opposite sides of the flexible substrate 210a.

The environmental sensitive electronic device 200L depicted in FIG. 14B is similar to the environmental sensitive electronic device 200K depicted in FIG. 14A, whereas one of the differences therebetween lies in that the touch layer TP of the environmental sensitive electronic device 200L depicted in FIG. 14B is adhered to the outer surface of the flexible substrate 210a through a third adhesive 240a, and the quarter-wave compensating and polarizing film POL is located on the touch layer TP. Here, the touch layer TP and the first adhesive 240 are respectively located on two opposite sides of the flexible substrate 210a, and the touch layer TP is located between the quarter-wave compensating and polarizing film POL and the first adhesive 240.

The environmental sensitive electronic device 200M depicted in FIG. 14C is similar to the environmental sensitive electronic device 200K depicted in FIG. 14A, whereas one of the differences therebetween lies in that the getter 10a of the environmental sensitive electronic device 200M depicted in FIG. 14C is distributed in the first adhesive 240 in form of particles, for instance. The getter 10a may be a transparent getter or an opaque getter for absorbing moisture and oxygen.

The environmental sensitive electronic device 200N depicted in FIG. 14D is similar to the environmental sensitive electronic device 200L depicted in FIG. 14B, whereas one of the differences therebetween lies in that the getter 10a of the environmental sensitive electronic device 200N depicted in FIG. 14D is distributed in the first adhesive 240 in form of particles, for instance. The getter 10a may be a transparent getter or an opaque getter for absorbing moisture and oxygen.

Figure 15A:
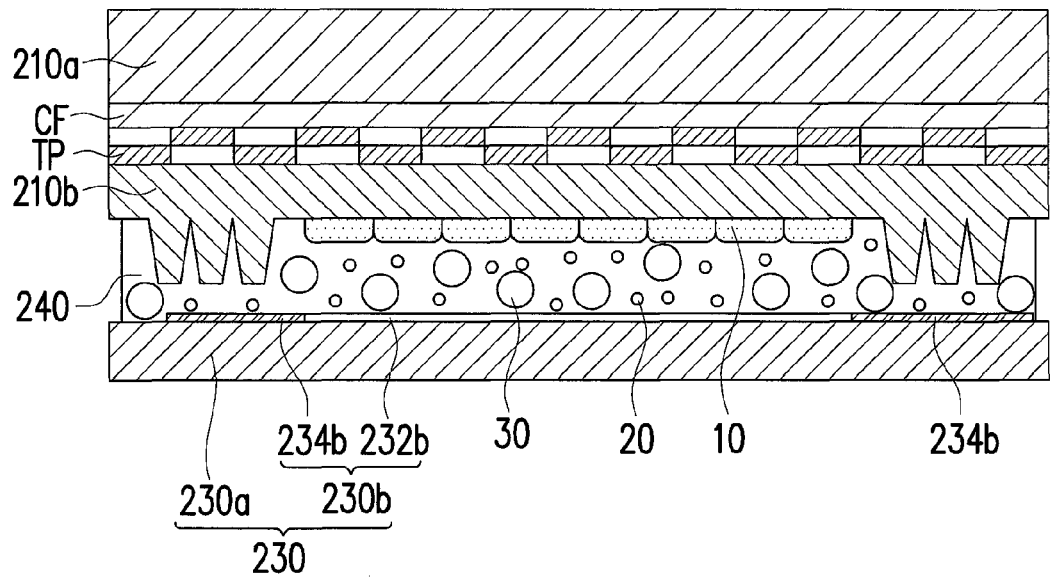
FIG. 15A is a schematic cross-sectional view illustrating an environmental sensitive electronic device according to the fifteenth exemplary embodiment of the disclosure.
Figure 15B:
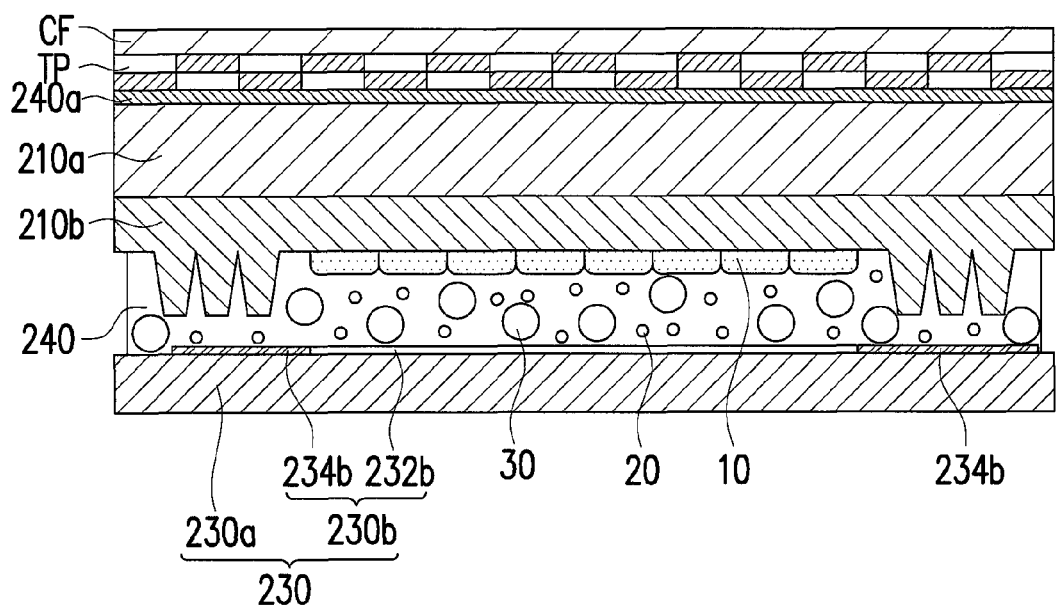
FIG. 15B is a schematic cross-sectional view illustrating an environmental sensitive electronic device according to the sixteenth exemplary embodiment of the disclosure.
Figure 15C:
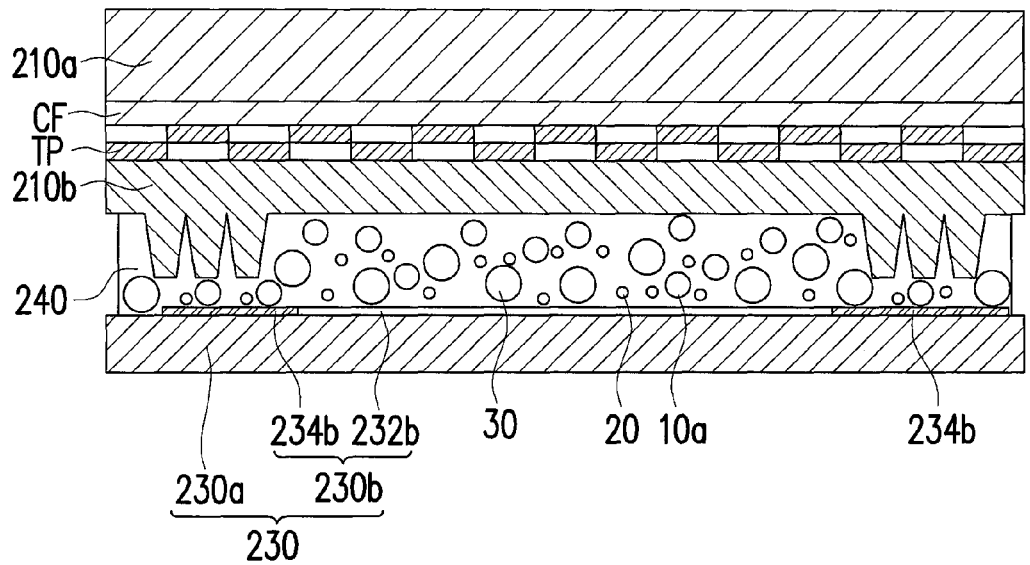
FIG. 15C is a schematic cross-sectional view illustrating an environmental sensitive electronic device according to the seventeenth exemplary embodiment of the disclosure.
Figure 15D:
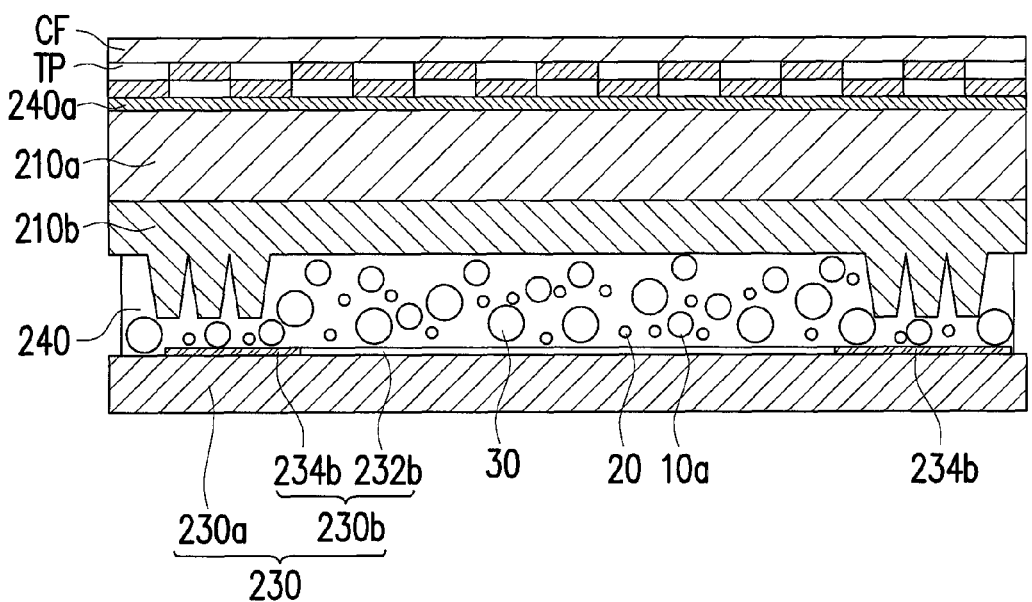
FIG. 15D is a schematic cross-sectional view illustrating an environmental sensitive electronic device according to the eighteenth exemplary embodiment of the disclosure.

FIG. 15A is a schematic cross-sectional view illustrating an environmental sensitive electronic device according to the fifteenth exemplary embodiment of the disclosure. FIG. 15B is a schematic cross-sectional view illustrating an environmental sensitive electronic device according to the sixteenth exemplary embodiment of the disclosure. FIG. 15C is a schematic cross-sectional view illustrating an environmental sensitive electronic device according to the seventeenth exemplary embodiment of the disclosure. FIG. 15D is a schematic cross-sectional view illustrating an environmental sensitive electronic device according to the eighteenth exemplary embodiment of the disclosure. The environmental sensitive electronic device 200O depicted in FIG. 15A is similar to the environmental sensitive electronic device 200G depicted in FIG. 13A, whereas one of the differences therebetween lies in that the environmental sensitive electronic device 200O depicted in FIG. 15A further includes a color filter layer CF that is located on the touch layer TP, and the color filter layer CF and the barrier layer 210b are respectively located on two opposite sides of the touch layer TP.

The environmental sensitive electronic device 200P depicted in FIG. 15B is similar to the environmental sensitive electronic device 200H depicted in FIG. 13B, whereas one of the differences therebetween lies in that the environmental sensitive electronic device 200P depicted in FIG. 15B further includes a color filter layer CF that is located on the touch layer TP, and the color filter layer CF and the barrier layer 210b are respectively located on two opposite sides of the touch layer TP.

The environmental sensitive electronic device 200Q depicted in FIG. 15C is similar to the environmental sensitive electronic device 200I depicted in FIG. 13C, whereas one of the differences therebetween lies in that the environmental sensitive electronic device 200Q depicted in FIG. 15C further includes a color filter layer CF that is located on the touch layer TP, and the color filter layer CF and the barrier layer 210b are respectively located on two opposite sides of the touch layer TP.

The environmental sensitive electronic device 200R depicted in FIG. 15D is similar to the environmental sensitive electronic device 200J depicted in FIG. 13D, whereas one of the differences therebetween lies in that the environmental sensitive electronic device 200R depicted in FIG. 15D further includes a color filter layer CF that is located on the touch layer TP, and the color filter layer CF and the barrier layer 210b are respectively located on two opposite sides of the touch layer TP.

Figure 16:
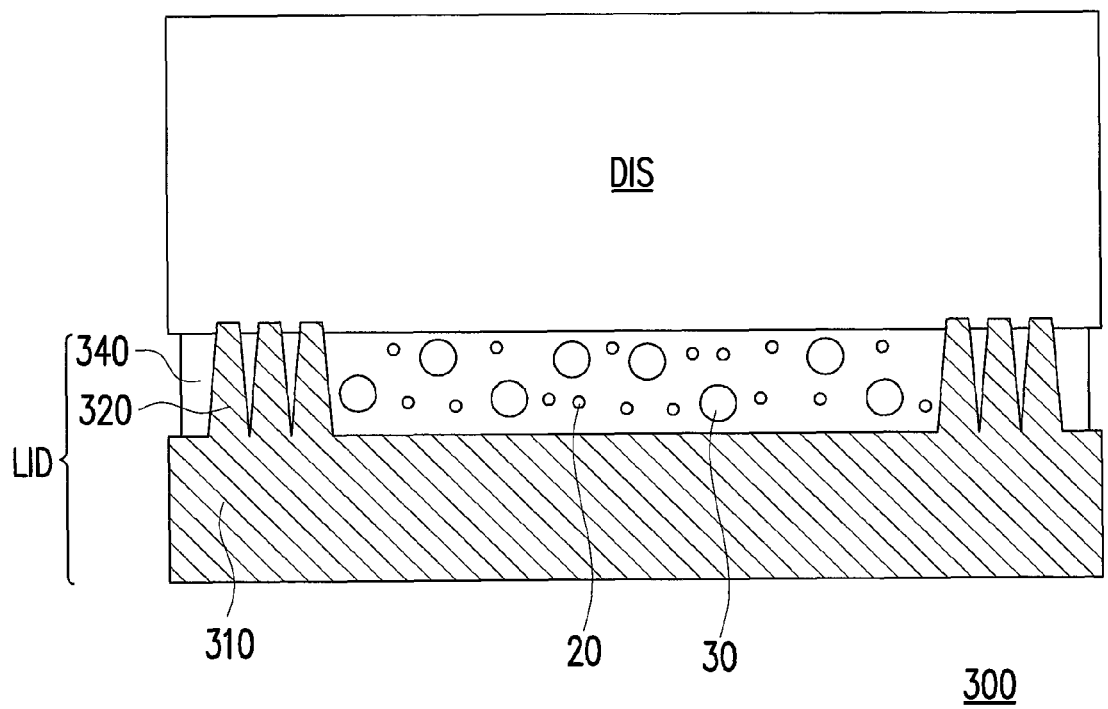
FIG. 16 is a schematic cross-sectional view illustrating a display apparatus according to an exemplary embodiment of the disclosure.

FIG. 16 is a schematic cross-sectional view illustrating a display apparatus according to an exemplary embodiment of the disclosure. With reference to FIG. 16, the display apparatus 300 described in the present exemplary embodiment at least includes a display panel DIS, a second substrate 310, at least one second side wall barrier structure 320, and a fourth adhesive 340. The second substrate 310 is located on one side of the display panel DIS. The second side wall barrier structure 320 is located on the second substrate 310 and between the display panel DIS and the second substrate 310. The fourth adhesive 340 is located between the second substrate 310 and the display panel DIS and covers the second side wall barrier structure 320. Here, the second substrate 310 and the second side wall barrier structure 320 are adhered to the display panel DIS through the fourth adhesive 340.

The display panel DIS refers to any one of the environmental sensitive electronic devices 200A to 200R shown in FIG. 9 to FIG. 15, respectively; that is, the display panel DIS at least includes the first substrate 210, at least one first side wall barrier structure 220, the environmental sensitive electronic device back plate 230, and the first adhesive 240. The first side wall barrier structure 220 is located on the first substrate 210. The first substrate 210 is located above the environmental sensitive electronic device back plate 230, and the first side wall barrier structure 220 is located between the first substrate 210 and the environmental sensitive electronic device back plate 230. The first adhesive 240 is located between the first substrate 210 and the environmental sensitive electronic device back plate 230 and covers the first side wall barrier structure 220. The first substrate 210 and the first side wall barrier structure 220 are adhered to the environmental sensitive electronic device back plate 230 through the first adhesive 240.

The second substrate 310, at least one second side wall barrier structure 320, and the fourth adhesive 340 together constituted a cover portion LID. To form the cover portion LID, after the releasing film 130 of one of the barrier functional films 100A to 100K is torn off, the one of the barrier functional films 100A to 100K is adhered to the other side of the environmental sensitive electronic device back plate 230 through the adhesive 140, and the side wall barrier structure 120 of the substrate 110 is closely engaged with the environmental sensitive electronic device back plate 230 through the adhesive 140 by means of a properly exerted force from a roller, flat-head press, cushion press, and so on, for instance. After the substrate 110 is laminated onto the environmental sensitive electronic device back plate 230. The substrate 110 then becomes the second substrate 310, and the side wall barrier structure 120 becomes the second side wall barrier structure 320. After that, the adhesive 140 is cured (by heat or ultraviolet light) to form the fourth adhesive 340. Through the fourth adhesive 340 (i.e., the cover portion LID) and the environmental sensitive electronic device back plate 230, the second substrate 310 and the second side wall barrier structure 320 may be firmly engaged with each other.

In the present exemplary embodiment, the environmental sensitive electronic device back plate 230 may include a flexible base material 230a and an environmental sensitive electronic device unit 230b arranged on the flexible base material 230a. The flexible base material 230a may be made of PI or may be any other flexible material. The environmental sensitive electronic device unit 230b includes an active device 232b and a circuit wire 234b, and the circuit wire 234b is electrically connected to the active device 232b. In the present exemplary embodiment, the active device 232b is, for instance, an active environmental sensitive electronic display device. The active environmental sensitive electronic display device is, for instance, an AM-OLED, an AM-EPD commonly known as electronic paper, an AM-LCD, or an AMB-PLCD.

The active device 232b includes a TFT (not shown), and the TFT may be a-Si TFT, metal oxide TFT, or p-Si TFT. The p-Si TFT may further include a low-temperature p-Si TFT, a high-temperature p-Si TFT, a CGS TFT, a SGS TFT, and so forth.

The fourth adhesive 340 further includes a heat dissipation auxiliary material 20 that is distributed in the fourth adhesive 340 in form of particles. The heat dissipation auxiliary material 20 has a high heat dissipation coefficient, such as diamond, a diamond-like material, copper, silver, gold, aluminum, platinum, a ceramic material, or an oxide thereof, so as to dissipate heat. The fourth adhesive 340 may also include an anti-electromagnetic interference material 30 that is distributed in the second adhesive 140 in form of particles, for instance. The anti-electromagnetic interference material 30 is gold, silver, copper, aluminum, carbon, carbon fiber or lead that may lessen electromagnetic effects.

In brief, the display apparatus 300 described herein may be formed by combining any of the environmental sensitive electronic devices 200A to 200R with one of the barrier functional films 100A to 100R of which the releasing film 130 is torn off. The second side wall barrier structure 320 may be the flexible base material 230a almost in contact with the display panel DIS or the flexible base material 230a where the display panel DIS is embedded, so as to block external moisture and oxygen. The cover portion LID adhered to any of the environmental sensitive electronic devices 200A to 200R may serve as a transparent cover plate or an opaque cover plate; that is, the display apparatus described herein may emit light from both sides or from only one side. The display apparatus described herein may be equipped with a touch function and may further achieve a moisture absorption effect, a heat dissipation effect, an anti-electromagnetic interference effect, and so forth.

According to the embodiments of the disclosure, each of the barrier functional films described herein has the adhesive through which the substrate and the releasing film are adhered to each other, and the side wall barrier structure is located on the substrate and between the substrate and the releasing film. Each of the environmental sensitive electronic devices and the display apparatus described herein have the adhesive through which the two substrates are adhered to each other. The side wall barrier structure is located between the two substrates, and at least one portion of the side wall barrier structure surrounds the active device of the environmental sensitive electronic device unit. The side wall barrier structure may be covered by the adhesive. That is, the barrier functional film, the environmental sensitive electronic device, and the display apparatus described herein are capable of blocking moisture and oxygen and are apt to be mass-produced.

The getter located on the substrate or distributed in the adhesive is introduced in the disclosure, and the adhesive has the heat dissipation auxiliary material and the anti-electromagnetic interference material. That is, the barrier functional film, the environmental sensitive electronic device, and the display apparatus described herein are capable of absorbing moisture and oxygen, dissipating heat, and lessening the electromagnetic interference effect. Thereby, the lifetime of the electronic device may be extended effectively.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A barrier functional film comprising:
    a substrate;
    at least one side wall barrier structure located on the substrate;
    a releasing film located above the substrate, wherein the at least one side wall barrier structure is located between the substrate and the releasing film; and
    an adhesive covering the at least one side wall barrier structure, the adhesive being located between the substrate and the releasing film.

2. The barrier functional film of claim 1, further comprising a getter located on the substrate and between the substrate and the adhesive, the getter being surrounded by the at least one side wall barrier structure.

3. The barrier functional film of claim 1, further comprising a getter distributed in the adhesive.

4. The barrier functional film of claim 1, further comprising a heat dissipation auxiliary material distributed in the adhesive.

5. The barrier functional film of claim 1, further comprising an anti-electromagnetic interference material distributed in the adhesive.

6. The barrier functional film of claim 1, wherein the substrate comprises a metal substrate or a glass substrate.

7. The barrier functional film of claim 1, wherein the substrate comprises:
    a flexible substrate; and
    at least one barrier layer located on the flexible substrate.

8. The barrier functional film of claim 7, further comprising a quarter-wave compensating and polarizing film located on the flexible substrate, the quarter-wave compensating and polarizing film and the at least one barrier layer being respectively located at two opposite sides of the flexible substrate.

9. The barrier functional film of claim 7, further comprising a touch layer located on the flexible substrate, the touch layer and the adhesive being respectively located on two opposite sides of the at least one barrier layer.

10. The barrier functional film of claim 9, further comprising a color filter layer located on the touch layer, the color filter layer and the at least one barrier layer being respectively located on two opposite sides of the touch layer.

11. The barrier functional film of claim 1, wherein the at least one side wall barrier structure comprises an enclosed structure surrounding on peripheral of the barrier functional film.

12. The barrier functional film of claim 1, wherein a shape of a cross-section of the at least one side wall barrier structure comprises a rectangular shape, a trapezoidal shape, a polygonal shape, a circular shape, or an elliptic shape, and the cross-section is perpendicular to the substrate.

13. A manufacturing method of a barrier functional film, comprising:
   forming at least one side wall barrier structure on a substrate;
   forming an adhesive on a releasing film; and
   adhering the releasing film to the substrate through the adhesive, wherein the adhesive covers the at least one side wall barrier structure, and the adhesive is located between the substrate and the releasing film.

14. The manufacturing method of claim 13, wherein a method of forming the at least one side wall barrier structure on the substrate comprises:
   coating forming a photoresist layer on the substrate with;
   performing exposure, development, and etching processes on the photoresist layer; and
   removing the photoresist layer to form the at least one side wall barrier structure.

15. The manufacturing method of claim 13, further comprising:
   forming a getter on the substrate, wherein the getter is located between the substrate and the adhesive and is surrounded by the at least one side wall barrier structure.

16. The manufacturing method of claim 13, wherein the barrier functional film further comprises a getter distributed in the adhesive.

17. The manufacturing method of claim 13, wherein the barrier functional film further comprises a heat dissipation auxiliary material distributed in the adhesive.

18. The manufacturing method of claim 13, wherein the barrier functional film further comprises an anti-electromagnetic interference material distributed in the adhesive.

19. The manufacturing method of claim 13, wherein the substrate comprises a metal substrate or a glass substrate.

20. The manufacturing method of claim 13, wherein the substrate further comprises:
   a flexible substrate; and
   at least one barrier layer formed on the flexible substrate.

21. The manufacturing method of claim 20, further comprising:
   forming a quarter-wave compensating and polarizing film on the flexible substrate, wherein the quarter-wave compensating and polarizing film and the at least one barrier layer are respectively located at two opposite sides of the flexible substrate.

22. The manufacturing method of claim 20, further comprising:
   forming a touch layer on the flexible substrate, wherein the touch layer and the adhesive are respectively located on two opposite sides of the at least one barrier layer.

23. The manufacturing method of claim 22, further comprising:
   forming a color filter layer on the touch layer, wherein the color filter layer and the at least one barrier layer are respectively located on two opposite sides of the touch layer.

24. The manufacturing method of claim 13, wherein the at least one side wall barrier structure comprises an enclosed structure surrounding on peripheral of the barrier functional film.

25. The manufacturing method of claim 13, wherein a shape of a cross-section of the at least one side wall barrier structure comprises a rectangular shape, a trapezoidal shape, a polygonal shape, a circular shape, or an elliptic shape, and the cross-section is perpendicular to the substrate.

26. An environmental sensitive electronic device comprising:
   a first substrate;
   at least one first side wall barrier structure located on the first substrate;
   an environmental sensitive electronic device back plate, wherein the first substrate is located above the environmental sensitive electronic device back plate, and the at least one first side wall barrier structure is located between the first substrate and the environmental sensitive electronic device back plate; and
   a first adhesive located between the first substrate and the environmental sensitive electronic device back plate, the first adhesive covering the at least one first side wall barrier structure, wherein the first substrate and the at least one first side wall barrier structure are adhered to the environmental sensitive electronic device back plate through the first adhesive.

27. The environmental sensitive electronic device of claim 26, wherein the environmental sensitive electronic device back plate comprises:
   a flexible base material; and
   an environmental sensitive electronic device unit located on the flexible base material.

28. The environmental sensitive electronic device of claim 27, wherein the environmental sensitive electronic device unit comprises an active device and a circuit wire, and the circuit wire is electrically connected to the active device.

29. The environmental sensitive electronic device of claim 26, further comprising a getter located on the first substrate and between the first substrate and the first adhesive, the getter being surrounded by the at least one first side wall barrier structure.

30. The environmental sensitive electronic device of claim 26, further comprising a getter distributed in the first adhesive.

31. The environmental sensitive electronic device of claim 26, further comprising a heat dissipation auxiliary material distributed in the first adhesive.

32. The environmental sensitive electronic device of claim 26, further comprising an anti-electromagnetic interference material distributed in the first adhesive.

33. The environmental sensitive electronic device of claim 26, wherein the first substrate comprises a metal substrate or a glass substrate.

34. The environmental sensitive electronic device of claim 26, wherein the first substrate comprises:
   a flexible substrate; and
   at least one barrier layer located on the flexible substrate.

35. The environmental sensitive electronic device of claim 34, further comprising a quarter-wave compensating and polarizing film located on the flexible substrate, the quarter-wave compensating and polarizing film and the at least one first side wall barrier being respectively located at two opposite sides of the first substrate.

36. The environmental sensitive electronic device of claim 34, further comprising a touch layer located on the flexible substrate, the touch layer and the first adhesive being respectively located on two opposite sides of the at least one barrier layer.

37. The environmental sensitive electronic device of claim 36, further comprising a color filter layer located on the touch layer, the color filter layer and the at least one barrier layer being respectively located on two opposite sides of the touch layer.

38. The environmental sensitive electronic device of claim of claim 26, wherein the at least one first side wall barrier structure comprises a enclosed structure surrounding environmental sensitive electronic device.

39. The environmental sensitive electronic device of claim 26, wherein a shape of a cross-section of the at least one first side wall barrier structure comprises a rectangular shape, a trapezoidal shape, a polygonal shape, a circular shape, or an elliptic shape, and the cross-section is perpendicular to the first substrate.

40. A display apparatus comprising:
an environmental sensitive electronic device;
a second substrate located on one side of the environmental sensitive electronic device;
at least one second side wall barrier structure located on the second substrate and between the environmental sensitive electronic device and the second substrate; and
a fourth adhesive located between the second substrate and the environmental sensitive electronic device, the fourth adhesive covering the at least one second side wall barrier structure, wherein the second substrate and the at least one second side wall barrier structure are adhered to the environmental sensitive electronic device through the fourth adhesive.

41. The display apparatus of claim 40, wherein the environmental sensitive electronic device comprises:
a first substrate; and
an environmental sensitive electronic device back plate, wherein the second substrate and the at least one second side wall barrier structure are adhered to the first substrate or the environmental sensitive electronic device back plate.

42. The display apparatus of claim 41, wherein the environmental sensitive electronic device back plate comprises:
a flexible base material; and
an environmental sensitive electronic device unit located on the flexible base material.

43. The display apparatus of claim 42, wherein the environmental sensitive electronic device unit comprises an active device and a circuit wire, and the circuit wire is electrically connected to the active device.

44. The display apparatus of claim 40, further comprising a getter located on the second substrate and between the second substrate and the fourth adhesive, the getter being surrounded by the at least one second side wall barrier structure.

45. The display apparatus of claim 40, further comprising a getter distributed in the fourth adhesive.

46. The display apparatus of claim 40, further comprising a heat dissipation auxiliary material distributed in the fourth adhesive.

47. The display apparatus of claim 40, further comprising an anti-electromagnetic interference material distributed in the fourth adhesive.

48. The display apparatus of claim 40, wherein the second substrate comprises a metal substrate or a glass substrate.

49. The display apparatus of claim 40, wherein the second substrate comprises:
a flexible substrate; and
at least one barrier layer located on the flexible substrate.

50. The display apparatus of claim 49, further comprising a quarter-wave compensating and polarizing film located on the flexible substrate, the quarter-wave compensating and polarizing film and the at least one first side wall barrier being respectively located at two opposite sides of the second substrate.

51. The display apparatus of claim 49, further comprising a touch layer located on the flexible substrate, the touch layer and the fourth adhesive being respectively located on two opposite sides of the at least one barrier layer.

52. The display apparatus of claim 51, further comprising a color filter layer located on the touch layer, the color filter layer and the at least one barrier layer being respectively located on two opposite sides of the touch layer.

53. The display apparatus of claim 40, wherein the at least one second side wall barrier structure comprises an enclosed structure surrounding environmental sensitive electronic device.

54. The display apparatus of claim 40, wherein a shape of a cross-section of the at least one second side wall barrier structure comprises a rectangular shape, a trapezoidal shape, a polygonal shape, a circular shape, or an elliptic shape, and the cross-section is perpendicular to the second substrate.

* * * * *